US008385113B2

(12) United States Patent
Pinkerton

(10) Patent No.: US 8,385,113 B2
(45) Date of Patent: Feb. 26, 2013

(54) NANOELECTROMECHANICAL SYSTEMS AND METHODS FOR MAKING THE SAME

(75) Inventor: Joseph F. Pinkerton, Austin, TX (US)

(73) Assignee: CJP IP Holdings, Ltd., Austin, TX (US)

( * ) Notice: Subject to any disclaimer, the term of this patent is extended or adjusted under 35 U.S.C. 154(b) by 1241 days.

(21) Appl. No.: 12/062,326

(22) Filed: Apr. 3, 2008

(65) Prior Publication Data

US 2012/0091430 A1    Apr. 19, 2012

Related U.S. Application Data

(60) Provisional application No. 60/921,923, filed on Apr. 3, 2007.

(51) Int. Cl.
*G11C 11/50* (2006.01)
(52) U.S. Cl. .................. 365/164; 365/157; 977/943
(58) Field of Classification Search .................. 365/164, 365/157; 977/943
See application file for complete search history.

(56) References Cited

U.S. PATENT DOCUMENTS

| | | |
|---|---|---|
| 2,979,551 A | 4/1961 | Pack |
| 3,181,365 A | 5/1965 | Maninger |
| 3,252,013 A | 5/1966 | Stanton |
| 3,365,653 A | 1/1968 | Gabor et al. |
| 3,495,101 A | 2/1970 | Slonneger |
| 3,500,451 A | 3/1970 | Stephen |
| 3,508,089 A | 4/1970 | Cheshire |
| 3,609,593 A | 9/1971 | Boll et al. |
| 4,152,537 A | 5/1979 | Hansch |
| 4,387,318 A | 6/1983 | Kolm et al. |
| 4,536,674 A | 8/1985 | Schmidt |
| 4,595,864 A | 6/1986 | Stiefelmeyer et al. |
| 4,814,657 A | 3/1989 | Yano et al. |
| 4,966,649 A | 10/1990 | Harada et al. |
| 4,979,149 A | 12/1990 | Popovic et al. |
| 5,065,085 A | 11/1991 | Aspden et al. |
| 5,132,934 A | 7/1992 | Quate et al. |
| 5,216,631 A | 6/1993 | Sliwa, Jr. |
| 5,233,873 A | 8/1993 | Mozgowiec et al. |
| 5,578,976 A | 11/1996 | Yao |

(Continued)

FOREIGN PATENT DOCUMENTS

| | | |
|---|---|---|
| DE | 101 23 876 | 11/2002 |
| EP | 0518283 | 12/1992 |

(Continued)

OTHER PUBLICATIONS

Jang et al., "Nanoelectromechanical DRAM for ultra-large-scale integration (ULSI)," Dec. 2005. Electron Devices Meetings, 2005. IEDM Tehcnical Digest. IEEE International. pp. 261-264.*

Baughman et al. "Carbon Nanotube Actuators," Science American Association for the Advancement of Science, U.S., vol. 284, May 21, 1999, pp. 1340-1344.

Cleland et al., "Fabrication of High Frequency Nanometer Scale Mechanical Resonators from Bulk Si Crystals," Appl. Phys. Lett., 69 (18), Oct. 28, 1996.

(Continued)

*Primary Examiner* — Alexander Sofocleous
*Assistant Examiner* — Lance Reidlinger
(74) *Attorney, Agent, or Firm* — Kramer Levin Naftalis & Frankel LLP

(57) ABSTRACT

Nanoelectromechanical systems are disclosed that utilize vertically grown or placed nanometer-scale beams. The beams may be configured and arranged for use in a variety of applications, such as batteries, generators, transistors, switching assemblies, and sensors. In some generator applications, nanometer-scale beams may be fixed to a base and grown to a desired height. The beams may produce an electric potential as the beams vibrate, and may provide the electric potential to an electrical contact located at a suitable height above the base. In other embodiments, vertical beams may be grown or placed on side-by-side traces, and an electrical connection may be formed between the side-by-side traces when beams on separate traces vibrate and contact one another.

22 Claims, 29 Drawing Sheets

U.S. PATENT DOCUMENTS

| | | | |
|---|---|---|---|
| 5,619,061 A | 4/1997 | Goldsmith et al. | |
| 5,621,258 A | 4/1997 | Stevenson | |
| 5,638,946 A | 6/1997 | Zavracky | |
| 5,649,454 A | 7/1997 | Midha et al. | |
| 5,677,823 A | 10/1997 | Smith | |
| 5,768,192 A | 6/1998 | Eitan | |
| 5,780,727 A | 7/1998 | Gimzewski et al. | |
| 5,835,477 A | 11/1998 | Binnig et al. | |
| 5,964,242 A | 10/1999 | Slocum | |
| 6,011,725 A | 1/2000 | Eitan | |
| 6,054,745 A | 4/2000 | Nakos et al. | |
| 6,069,540 A | 5/2000 | Berenz et al. | |
| 6,073,484 A | 6/2000 | Miller et al. | |
| 6,114,620 A | 9/2000 | Zuppero et al. | |
| 6,123,819 A | 9/2000 | Peeters | |
| 6,127,744 A | 10/2000 | Streeter et al. | |
| 6,127,765 A | 10/2000 | Fushinobu | |
| 6,157,042 A | 12/2000 | Dodd | |
| 6,160,230 A | 12/2000 | McMillan et al. | |
| 6,256,767 B1 | 7/2001 | Kuekes et al. | |
| 6,261,469 B1 | 7/2001 | Zakhidov et al. | |
| 6,300,756 B2 | 10/2001 | Sturm et al. | |
| 6,327,909 B1 | 12/2001 | Hung et al. | |
| 6,424,079 B1 | 7/2002 | Carroll | |
| 6,433,543 B1 | 8/2002 | Shahinpoor et al. | |
| 6,445,006 B1 | 9/2002 | Brandes et al. | |
| 6,445,109 B2 | 9/2002 | Perçin et al. | |
| 6,509,605 B1 | 1/2003 | Smith | |
| 6,515,339 B2 | 2/2003 | Shin et al. | |
| 6,528,785 B1 | 3/2003 | Nakayama et al. | |
| 6,534,839 B1 | 3/2003 | Frazier et al. | |
| 6,548,841 B2 | 4/2003 | Frazier et al. | |
| 6,559,550 B2 | 5/2003 | Herman | |
| 6,574,130 B2 | 6/2003 | Segal et al. | |
| 6,593,666 B1 | 7/2003 | Pinkerton | |
| 6,593,731 B1 | 7/2003 | Roukes et al. | |
| 6,597,048 B1 | 7/2003 | Kan | |
| 6,611,033 B2 | 8/2003 | Hsu et al. | |
| 6,625,047 B2 * | 9/2003 | Coleman, Jr. | 365/51 |
| 6,643,165 B2 | 11/2003 | Segal et al. | |
| 6,653,547 B2 | 11/2003 | Akamatsu | |
| 6,669,256 B2 | 12/2003 | Nakayama et al. | |
| 6,672,925 B2 | 1/2004 | Talin et al. | |
| 6,674,932 B1 | 1/2004 | Zhang et al. | |
| 6,677,624 B2 | 1/2004 | Ihm | |
| 6,685,810 B2 | 2/2004 | Noca et al. | |
| 6,708,491 B1 | 3/2004 | Weaver et al. | |
| 6,730,370 B1 | 5/2004 | Olafsson | |
| 6,756,795 B2 | 6/2004 | Hunt et al. | |
| 6,762,116 B1 | 7/2004 | Skidmore | |
| 6,774,533 B2 | 8/2004 | Fujita et al. | |
| 6,803,840 B2 | 10/2004 | Hunt et al. | |
| 6,805,390 B2 | 10/2004 | Nakayama et al. | |
| 6,806,624 B2 | 10/2004 | Lee et al. | |
| 6,828,800 B2 | 12/2004 | Reich et al. | |
| 6,833,567 B2 | 12/2004 | Choi et al. | |
| 6,846,682 B2 | 1/2005 | Heath et al. | |
| 6,848,320 B2 | 2/2005 | Miyajima et al. | |
| 6,882,051 B2 | 4/2005 | Majumdar et al. | |
| 6,905,655 B2 | 6/2005 | Gabriel et al. | |
| 6,911,682 B2 | 6/2005 | Rueckes et al. | |
| 6,914,329 B1 | 7/2005 | Lee et al. | |
| 6,953,977 B2 | 10/2005 | Mlcak et al. | |
| 6,963,117 B2 | 11/2005 | Yang et al. | |
| 7,071,023 B2 | 7/2006 | Bertin et al. | |
| 7,075,141 B2 | 7/2006 | Rueckes et al. | |
| 7,095,645 B2 | 8/2006 | Pinkerton et al. | |
| 7,148,579 B2 | 12/2006 | Pinkerton et al. | |
| 7,196,450 B2 | 3/2007 | Pinkerton et al. | |
| 7,199,498 B2 | 4/2007 | Pinkerton et al. | |
| 7,256,063 B2 | 8/2007 | Pinkerton et al. | |
| 7,304,416 B2 | 12/2007 | Mullen | |
| 7,336,527 B1 * | 2/2008 | McClelland | 365/164 |
| 7,348,591 B2 * | 3/2008 | Yamauchi et al. | 257/9 |
| 7,719,111 B2 * | 5/2010 | Jang et al. | 257/741 |
| 8,064,249 B2 * | 11/2011 | Jang et al. | 365/164 |
| 2002/0021860 A1 | 2/2002 | Ruan | |
| 2002/0024099 A1 | 2/2002 | Watanabe et al. | |
| 2002/0039620 A1 | 4/2002 | Shahinpoor et al. | |
| 2002/0043895 A1 | 4/2002 | Richards et al. | |
| 2002/0130353 A1 | 9/2002 | Lieber et al. | |
| 2002/0167374 A1 | 11/2002 | Hunt et al. | |
| 2002/0175408 A1 | 11/2002 | Majumdar et al. | |
| 2002/0180306 A1 | 12/2002 | Hunt et al. | |
| 2003/0033876 A1 | 2/2003 | Roukes et al. | |
| 2003/0036332 A1 | 2/2003 | Talin | |
| 2003/0151257 A1 | 8/2003 | Pinkerton | |
| 2003/0172726 A1 | 9/2003 | Yasutake et al. | |
| 2003/0175161 A1 | 9/2003 | Gabriel et al. | |
| 2004/0012062 A1 | 1/2004 | Miyajima et al. | |
| 2004/0157304 A1 | 8/2004 | Guo | |
| 2004/0182431 A1 | 9/2004 | Zuppero et al. | |
| 2004/0238907 A1 | 12/2004 | Pinkerton et al. | |
| 2004/0239210 A1 | 12/2004 | Pinkerton et al. | |
| 2004/0240252 A1 | 12/2004 | Pinkerton et al. | |
| 2005/0104085 A1 | 5/2005 | Pinkerton et al. | |
| 2005/0179339 A1 | 8/2005 | Pinkerton et al. | |
| 2005/0218398 A1 | 10/2005 | Tran | |
| 2005/0258717 A1 | 11/2005 | Mullen | |
| 2006/0086994 A1 | 4/2006 | Viefers et al. | |
| 2007/0018537 A1 | 1/2007 | Pinkerton et al. | |
| 2007/0085444 A1 | 4/2007 | Pinkerton et al. | |
| 2008/0011058 A1 | 1/2008 | Lal et al. | |

FOREIGN PATENT DOCUMENTS

| | | |
|---|---|---|
| EP | 0977345 | 2/2000 |
| JP | 02004516 | 1/1990 |
| JP | 3074105 | 10/2000 |
| JP | 2001-157470 | 6/2001 |
| WO | WO 00/52722 | 9/2000 |
| WO | WO 01/03208 | 1/2001 |
| WO | WO 01/20760 | 3/2001 |
| WO | WO 01/93343 | 12/2001 |
| WO | WO 02/080360 | 10/2002 |
| WO | WO 03/001657 | 1/2003 |
| WO | WO 03/021613 | 3/2003 |
| WO | WO 03/078305 | 9/2003 |
| WO | 2007146769 A2 | 12/2007 |

OTHER PUBLICATIONS

Dequesnes M et al., "Calculation of pull-in voltages for carbon-nanotube-based nanoelectromechanical switches," nanotechnology IOP publishing UK, vol. 13, Jan. 22, 2002, pp. 120-131.

Dresselhaus et al.; "Carbon Nanotubes: Synthesis, Structure, Properties, and Applications"; Springer-Verlag Berlin Heidelberg 2001; pp. 198-199, 292-293.

Halg, Beat, "On a micro-electro-mechanical nonvolatile memory cell," IEEE Trans., Electron Devices, vol. 37, No. 10 (Oct. 1990) pp. 2230-2236.

Halliday et al.; "Physics. Third Edition"; John Wiley & Sons, Inc.; 1978; pp. 529-531.

Kinaret J.M. et al. "A Carbon-Nanotube-Based Nanorelay", Applied Physics Letters, American Institute of Physics, New York, USA, vol. 8, No. 8, pp. 1287-1289.

Ponomarenko et al. "Properties of boron carbide nanotubes: density-functional-based tight-binding calculations," Database Inspec Online!, Institute of Electrical Engineers, Stevenage, GB; Database accession No. 7588110, XP002278946, abstract Physical Review B (Condensed Matter and Material Physics), vol. 67, No. 12, pp. 125401-1-5, Mar. 15, 2003.

Rueckes et al., "Carbon nanotube-based nonvolatile random access memory for molecular computing," Science, vol. 289 (Jul. 7, 2000), pp. 94-97.

Sung et al. "Well-aligned carbon nitride nanotubes synthesized in anodic alumina by electron cyclotron resonance chemical vapor deposition," Applied Physics Letters, vol. 74, No. 2, pp. 197-199, Jan. 11, 1999.

Wang, Zhong Lin et al. "Piezoelectric Nanogenerators Based on Zinc Oxide Nanowire Arrays," Science Magazine—Biochemistry: Tools for New Frontiers, vol. 312, pp. 242-246, Apr. 14, 2006.

White D R et al., "The status of Johnson Noise Thermometry," Metrologia Bur. Int. Poids & Measures, France, vol. 33, 1996, pp. 325-335.

\* cited by examiner

NANOELECTROMECHANICAL SYSTEMS AND METHODS FOR MAKING THE SAME

CROSS-REFERENCE TO RELATED APPLICATION

This claims the benefit under 35 U.S.C. §119(e) of U.S. Provisional Application No. 60/921,923, filed Apr. 3, 2007, which is hereby incorporated by reference herein in its entirety.

BACKGROUND OF THE DISCLOSURE

The present invention relates generally to nanoelectromechanical (NEM) systems, and more particularly to NEM systems that may be used in various applications, such as energy conversion and switching systems.

NEM systems that are structured around nanometer-scale beams, such as nanotubes or nanowires, are known. Such systems are described, for example, in commonly assigned copending U.S. patent application Ser. No. 10/453,783, filed Jun. 2, 2003, which is hereby incorporated herein by reference in its entirety. This prior application illustrates, among other things, NEM switching assemblies that are constructed using millions or billions of nanometer-scale beams. For example, FIGS. 4 and 5 illustrate techniques for interconnecting a plurality of beam-based structures to form useful NEM assemblies.

SUMMARY OF THE DISCLOSURE

NEM systems, and methods of making such systems, are disclosed that utilize vertically grown or vertically placed beams. These systems may include a plurality of such beam-based assemblies that are interconnected to form useful structures.

In some embodiments, nanometer-scale generators are provided that use vertically grown nanometer-scale beams to produce power. The nanometer-scale generators may produce power, for example, as the nanometer-scale beams vibrate. Nanometer-scale beams may vibrate as a result of variations in heat or light or as a result of electrostatic or electromagnetic forces. A nanometer-scale beam may be a nanowire, piezoelectric element, a carbon nanotube, or any other type of beam-like structure. In some embodiments, the nanometer-scale beams may be provided as zinc-oxide nanowires.

As a nanometer-scale beam vibrates, the beam can produce a voltage across the length of the beam due to mechanical stresses on the beam. The present invention provides various generator assemblies that can harness this power generated by nanometer-scale beams. In one embodiment, the NEM generator can include one or more plates suspended above a base. Nanometer-scale beams may be grown or placed on the base such that the beams extend perpendicularly (e.g., vertically) from the base and towards a suspended plate. The suspended plate can include a plurality of circular apertures. Some of the nanometer-scale beams may be aligned with the apertures such that the beams extend at least partially through their respective apertures. When the beams vibrate within these apertures, the beams may each bend such that the beams electrically couple an inner surface of their respective apertures. This allows for the power generated by the beams to be provided across the base and the suspended plate.

In another embodiment of the present invention, the vertically grown beams may be placed or grown in cylindrical channels. Each of the vertical beams may be fixed at one end to a base that is electrically conductive and may extend through a channel. In particular, the beam may extend through a nonconductive portion of the channel and towards a portion of the channel that is electrically conductive. Each beam may be fabricated such that the beam does not contact the electrically conductive potion of the channel unless the beam physically bends and generates power. Thus, when the nanometer-scale beams vibrate, the beams may provide power across the base and the electrically conductive portion of the channel.

In another embodiment of the present invention, vertical beams may be grown or placed on side-by-side traces. The traces may be, for example, electrically conductive traces that are fabricated using conventional semiconductor processing techniques. The two traces may be separated by a distance that prevents the beams on different traces from touching one another when the beams are stationary. The beams on separate traces may touch when the beams vibrate (and therefore generate a voltage in some embodiments) and at least one beam on a first trace bends towards the other trace, at least one beam on the other trace bends towards the first trace, or beams on the different traces bend towards each other. In this manner, the power generated by the beams on one or both of the traces may be provided across the two traces. An electric field generator may be provided that produces an electric field across the side-by-side traces. By varying the direction and intensity of the electric field, the direction of power flow and the amount of power that is generated may be adjusted.

The NEM systems constructed in accordance with the present invention can be used in applications other than power generation. For example, NEM systems with side-by-side traces can be configured for use as switching assemblies. The side-by-side traces may be provided with charges of opposite polarity. Based on the direction and intensity of the electric field provided by the electric field generator, the beams on one trace may be repelled or attracted to the beams on the other trace. Thus, by varying the electric field, the contact rate between the beams on the different traces may be altered such that beams on separate traces rarely connect (an OFF state) or the beams on separate traces are nearly constantly connected (an ON state).

The NEM systems of the present invention can be constructed such that millions, if not billions or trillions, of nanometer-scale beam-based generators can be used to create a useful amount of energy. The techniques for creating such systems may be practical and easy to fabricate, even for large numbers of beam-based generators. The NEM systems may be constructed such that millions, billions, or trillions of beam-based generators are placed in parallel, and these parallel beam-based generators are placed in series with any suitable number (e.g., millions, billions, or trillions) of other beam-based generators coupled in parallel. The parallel connections increase the effective contact rate and reduce the effective resistance of the generator, thereby increasing the amount of current the NEM system can conduct. The series connections allow the generated voltages to be summed to useful levels.

The NEM systems constructed in accordance with the present invention may have high tolerance to fabrication variations. For example, the NEM systems may operate properly even with variations in beam length or in the presence of misplaced or additional nanometer-scale beams.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Nanoelectromechanical generators are disclosed that include a plurality of beam-based generators. Each beam-based generator may generate power using, for example, the piezoelectric properties of a nanowire. Billions or trillions of beam-based generators may be connected to obtain an assembly that can generate a useful amount of power.

Figure 1:
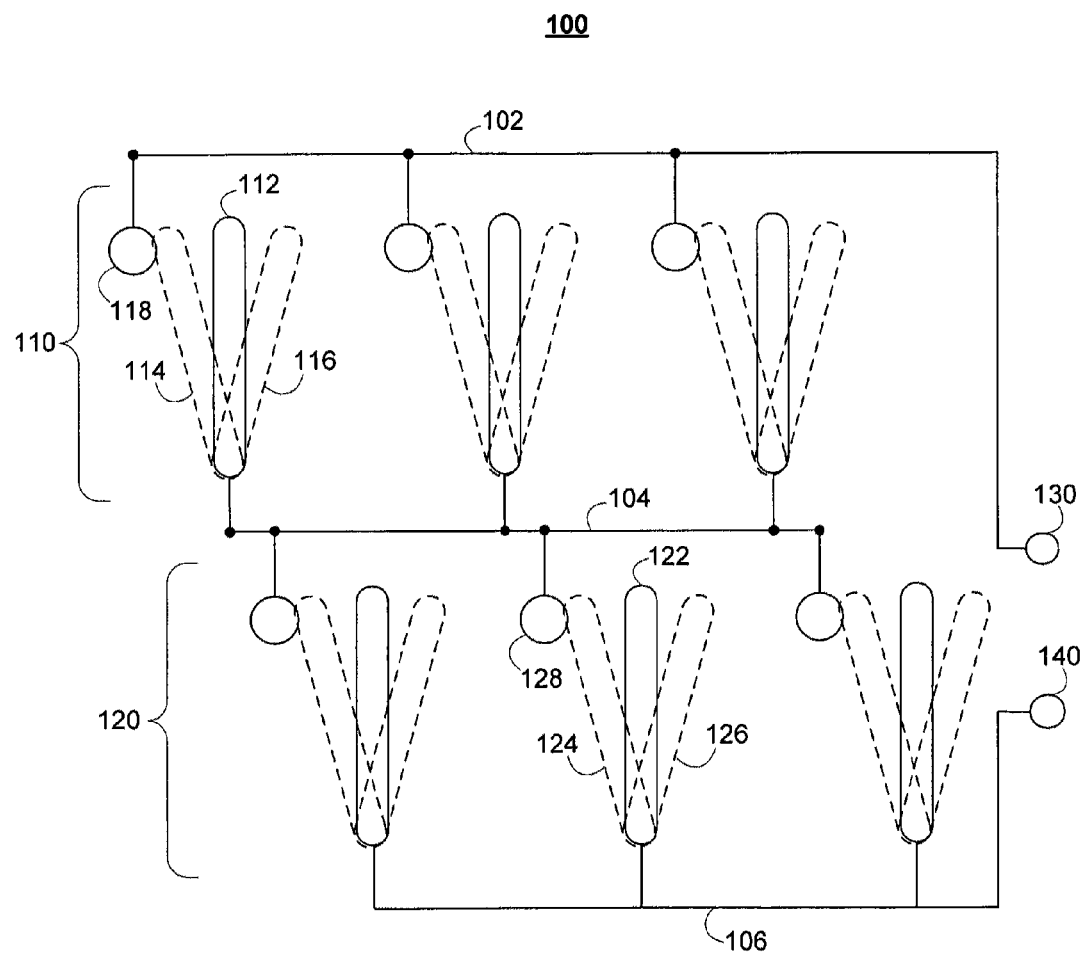
FIG. 1 is a schematic diagram of an illustrative nanoelectromechanical generator constructed in accordance with the principles of the present invention.

FIG. 1 is a schematic diagram of nanoelectromechanical system 100 illustrating one approach for connecting nanometer-scale generators such that a useful amount of power may be generated. NEM system 100 includes a plurality of generators that are structured around vertical beams. Each generator may include a vertically grown or placed nanometer-scale beam that is able to electrically couple a contact located in the proximity of the beam. For example, a first generator may be formed from nanometer-scale beam 112 and contact 118. Beam 112 may be fixed at one end to line 104 and may have a portion that is free-to-move (e.g., a free-moving top portion). The free-moving portion may vibrate between positions 114 and 116, producing an electric potential due to mechanical stresses on beam 112. The electric potential generated by beam 112 may be provided to contact 118 each time the free-moving portion of beam 112 touches contact 118. The free-moving portion can vibrate as a result of, for example, ambient temperature, light, or electromagnetic or electrostatic forces.

Beam 112 may produce a first voltage across lines 104 and 106 when the free-moving portion of beam 112 electrically couples contact 118. Similarly, beam 122 may vibrate between positions 124 and 126, and may provide a second voltage across line 106 and line 104 when beam 122 touches contact 128. Therefore, the amount of power generated by beams 112 and 114 depends on the frequency or rate in which these beams come into contact with their respective contact. The contact rate may be influenced by external or environmental conditions and fluctuations, which may cause the amount and speed of vibration of beams 112 and 114 to increase or decrease. Thus, in some embodiments, a heat source, light source, or electric/magnetic field generator (not shown) may be included in NEM system 100 to affect the productivity of NEM system 100.

To effectively utilize the energy generated by the beam-based generators in NEM system 100, the generators may be arranged into multiple rows connected in series. In this way, the voltage produced by the generators in one row can be summed with the voltage produced by the generators in an adjacent row. For example, NEM system 100 can include row 110 and row 120, which have nanometer-scale beams that are connected in series. The beams of row 120, such as beam 122, may produce a first voltage across lines 106 and 104, and the beams of row 110, such as beam 112, may produce a second voltage across lines 102 and 104. The first and second voltages are summed and provided across lines 102 and 106, which may be supplied as an output of NEM system 100 using output contacts 130 and 140. Although NEM system 100 is shown as having two rows, persons skilled in the art will appreciate that a NEM system can be constructed to include any number (e.g., trillions) of rows.

Each beam in NEM system 100 of FIG. 1 may have a high electrical resistance, which limits the amount of power that an individual generator can provide. For example, a beam-based generator constructed around a nanowire may have a resistance on the order of 1000 ohms. To decrease the effective resistance of the generators in each row or NEM system 100, a plurality of generators may be coupled in parallel. This parallel configuration provides additional paths through which current can flow between a pair of lines. Therefore, increasing the number of parallel generators decreases the effective resistance between the pair of lines. Persons skilled in the art will also appreciate that a parallel configuration increases the effective contact rate for a row of generators, since a greater number of contact events may occur during any given time interval. Although only three beam-based generators are depicted in each row in FIG. 1, persons skilled in the art would appreciated that any number of generators may be connected in parallel such a suitably small effective resistance may be achieved. For example, rows 110 and 120 can be constructed instead to include billions or trillions of nanometer-scale beam-based generators to reduce the effective resistance of each row to one micro-ohm or less.

Figure 2:
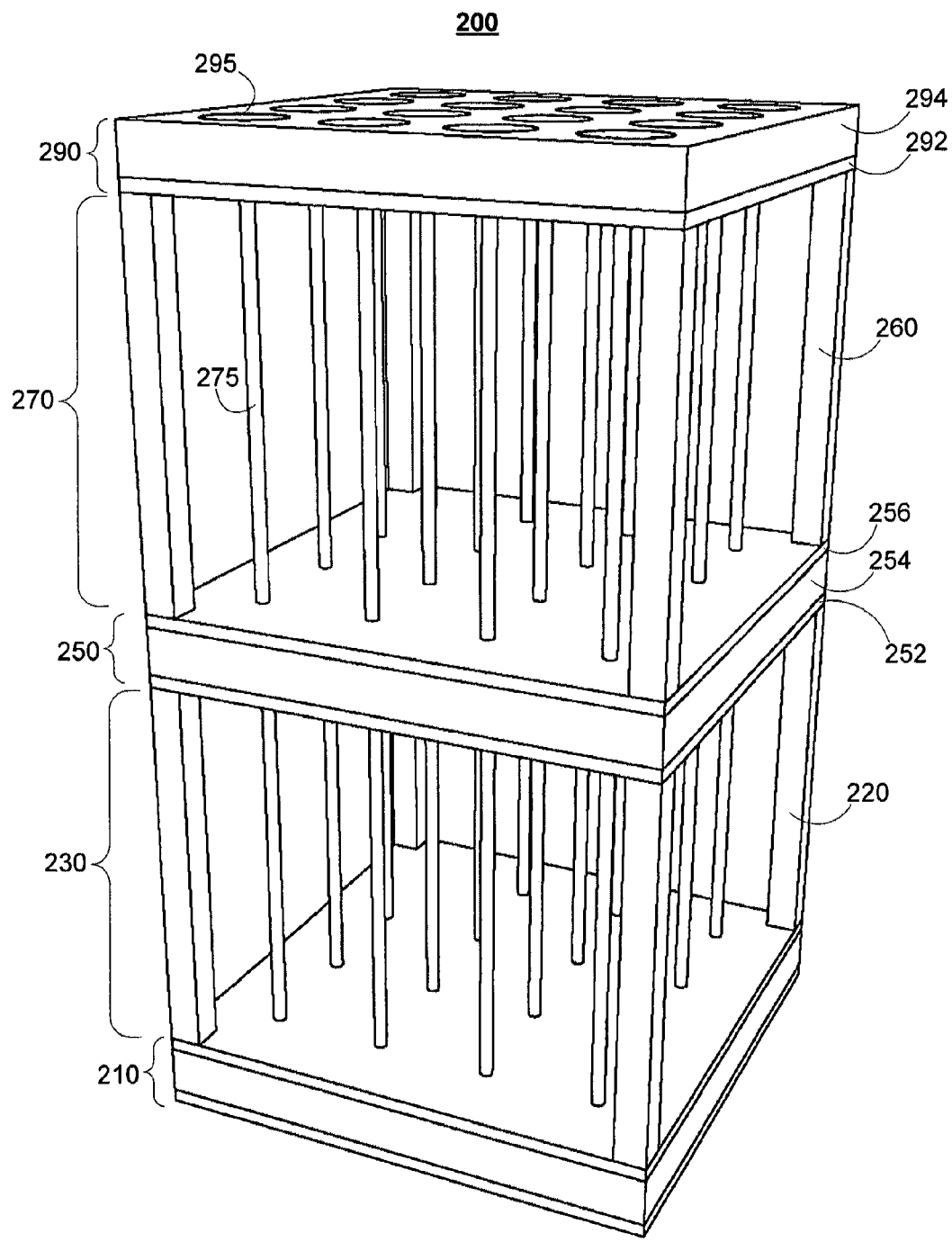
FIG. 2 is a three-dimensional perspective view of an illustrative nanoelectromechanical system constructed in accordance with the principles of the present invention.

Various nanoelectromechanical systems having a structure similar to that of NEM system 100 of FIG. 1 are disclosed. Turning to FIG. 2, a perspective view of nanoelectromechanical system 200 is shown that is constructed to have a similar structure as NEM system 100 of FIG. 1. NEM system 200 includes a plurality of vertically grown or vertically placed beams. The vertical beams may be nanowires, such as zinc-oxide nanowires, that are arranged in two levels: level 230 and level 270. NEM system 200 can also include plate 210, plate 250, plate 290, which are suspended above one another by mounting assemblies that include brace 220 and brace 260. NEM system 200 can be similar to NEM system 100 of FIG. 1 in that NEM system 100 may model the operation and/or components of NEM system 200. For example, plates 210, 250, and 290 may be similar to lines 106, 104, and 102 of FIG. 1, respectively. Each nanowire in FIG. 2, such as nanowire 275, may be modeled by a nanometer-scale beam in FIG. 1, such as beam 112. Thus, the nanowires in level 230 of FIG. 2 may be similar to the beams in row 120 and the nanowires in level 270 may be similar to the beams in row 110.

Nanowire 275 may be grown from or placed on layer 256 of plate 250 such that nanowire 275 extends perpendicularly from plate 250 and towards plate 290. Layer 256 may be a top layer of plate 250 and can be electrically conductive. For example, layer 256 may be made of aluminum or copper. Nanowire 275 may be fixed at one end to layer 256 and may be free-moving at the other end. The free-moving portion of nanowire 275 can vibrate and provide an electric potential to a conductive portion of plate 290. In particular, nanowire 275 may be operable to provide a voltage across plate 250 and plate 290 when the free-moving portion of nanowire 275 comes into contact with an inner portion of aperture 295 within plate 290.

Plate 290 may include insulating layer 292 and conductive layer 294, through which aperture 295 and other apertures are formed. The apertures may be cylindrically shaped, and each aperture may be substantially aligned with one of the nanowires grown or placed on layer 256. For example, nanowire 275 may be substantially aligned with aperture 295. The plurality of apertures, including aperture 295, may be more readily appreciated from FIG. 3, which shows NEM system 200 from an overhead perspective.

Figure 3:
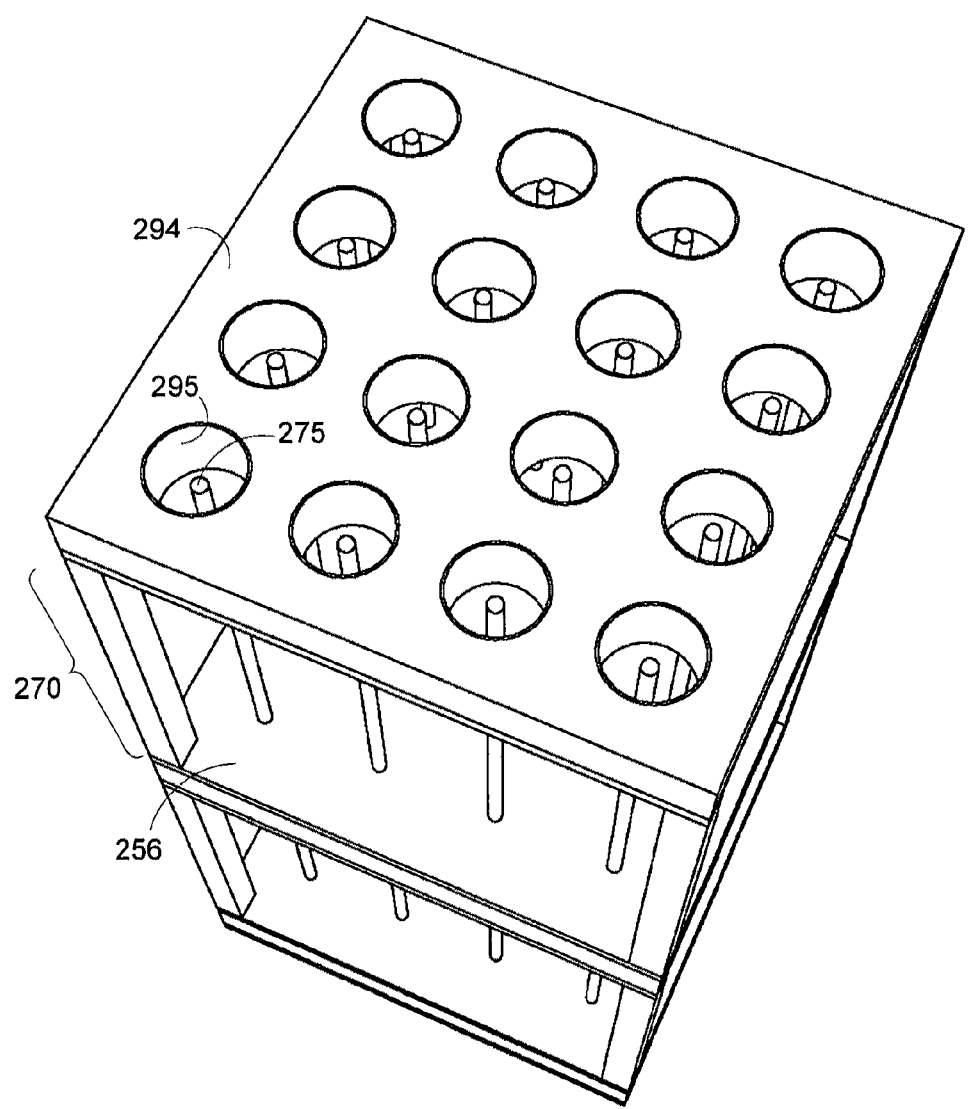
FIG. 3 is an overhead view of the illustrative nanoelectromechanical system of FIG. 2.

In FIG. 3, nanowire 275 is shown to extend at least partially through aperture 295, where nanowire 275 may be aligned at approximately the center of aperture 295. To grow nanowire 275 such that nanowire 275 is aligned within aperture 295, a metallic seed may be dropped through the center of aperture 295, and nanowire 256 may be grown to an appropriate height. Conductive layer 294 may made of any electrically conductive material, such as aluminum or copper. The inner surface of aperture 295 may therefore be electrically conductive and is able to receive the electric potential generated by nanowire 275. Therefore, nanowire 275 can provide the generated electric potential to conductive layer 294 when nanowire 275 bends and comes into contact with conductive layer 294 on the inner surface of aperture 295.

Nanowire 275 may touch the inner surface of aperture 295 when nanowire 275 bends at any angle relative to conductive layer 294. That is, because aperture 295 can completely surround a free-moving portion of nanowire 275, nanowire 275 may come into contact with aperture 295 regardless of the direction in which the free-moving portion of nanowire 275 bends. Nanowire 275 may bend in many or all different directions as a result of random vibration. Therefore, providing an aperture that allows nanowire 275 to contact conductive layer 294 regardless of the angle of movement maximizes the possible contact rate and power generation capabilities of nanowire 275. If nanowire 275 is positioned in the center of aperture 295, providing circular apertures in conductive layer 294 makes it so that nanowire 275 needs to bend the same amount in any direction to contact the inner surface of aperture 295. Again, since nanowire 275 may bend at any or all directions when nanowire 275 vibrates, providing circularly apertures may maximize the power output of NEM system 200. Persons skilled in the art will appreciate, however, that apertures of different shapes may be provided in conductive layer 294. For example, the apertures may be triangular, hexagonal, elliptical, rectangular, or any other of a variety of shapes.

As mentioned above, the apertures of plate 290 may also be provided through insulating layer 292. Insulating layer 292 may be constructed using any suitable electrically insulating material, such as silicon. Insulating layer 292 may be the bottom layer of plate 292, and can ensure that the nanowires of level 270, such as nanowire 275, do not contact conductive layer 294 except through the apertures. In some embodiments, the inner surface of the apertures through layers 292 and 294 may be coated with a conductive material. For example, the inner surface of each aperture may be coated with a diamond film. In these embodiments, nanowire 275 can touch any part within the inner surface of aperture 295 to form an electrical connection, and not just the part corresponding to conductive layer 294. The importance of including of including insulating layer 292 will become apparent below in connection with the description of FIGS. 4 and 5.

NEM system 200 may be tolerant to variations in nanowire height. For example, nanowire 275 may extend completely through aperture 295, nanowire 275 may extend partially through aperture 295, or nanowire 275 may only just reach the height of conductive layer 294. In any of these cases, nanowire 275 may be able to contact an inner portion of aperture 295 when nanowire 275 vibrates. Therefore, NEM system 200 can be resilient to manufacturing variations when growing nanowires, and NEM system 200 can operate even with nanowires that have different heights.

The other nanowires on level 270, may also provide an electric potential to layer 294 using their respective apertures in a similar manner as nanowire 275. Thus, as all of the nanowires are able to generate power across layer 256 of plate 250 and layer 294 of plate 290, these nanowires may be viewed as nanometer-scale generators that are coupled in parallel.

NEM system 200 can include a plurality of levels that are divided by and structured around the different plates (e.g., plates 110, 150, and 190) in NEM system 200. The plates can be suspended from one another by brace structures, such as brace 220 and brace 260. Brace 220, for example, can be placed on plate 210 such that brace 220 extends perpendicularly from plate 210. Plate 250 may then be mounted on top of brace 220 to suspend plate 250 above plate 220. Brace 220, as well as the other braces in NEM system 200, may be made of a nonconductive material. Therefore, brace 220 can act as a support structure that does not create a short circuit between plate 210 and plate 250. Many such braces can be included to provide a sturdy mounting structure for suspending plate 250 above plate 220. NEM system 200 is depicted to include four braces for each level of nanowires. This is merely illustrative, and persons skilled in the art would appreciate that any number of braces can be included in the mounting structure to ensure that a sturdy structure is constructed.

Each plate in NEM system 200 can function as a top plate for nanowires of a previous level and a bottom plate for growing or placing nanowires of a next level. For example, plate 250 can function as the top plate for nanowires in level 230 and as a bottom plate for nanowires in level 270. Therefore, plate 250 can include the layers necessary to receive an electric potential generated by the nanowires in level 230 (e.g., inculating layer 254 and conductive layer 254) and the layers necessary for growing nanowires in level 270 (e.g., conductive layer 256). Conductive layer 256 may be included in plate 250 so that the entire top surface of plate 250 can be used for growing or placing nanowires in the next level. Conductive layers 254 and 256 may be electrically coupled to one another. With this configuration, the electric potential provided by the nanowires of level 230 may be provided to the base of the nanowires on level 260. Plate 250 therefore allows for a series connection between the nanowires of level 220 and the nanowires of level 270.

Although only two levels of nanowires are shown in FIG. 2, this is merely illustrative. Persons skilled in the art will appreciate that any suitable number (e.g., trillions) of levels of nanometer-scale generators can be constructed according to the principles of the present invention. For example, a third level of nanowires can be added to NEM system 200. More particularly, a conductive layer similar to conductive layer 256 can be placed on top of conductive layer 295, and additional nanowires can be grown or placed on this conductive layer.

Figure 4:
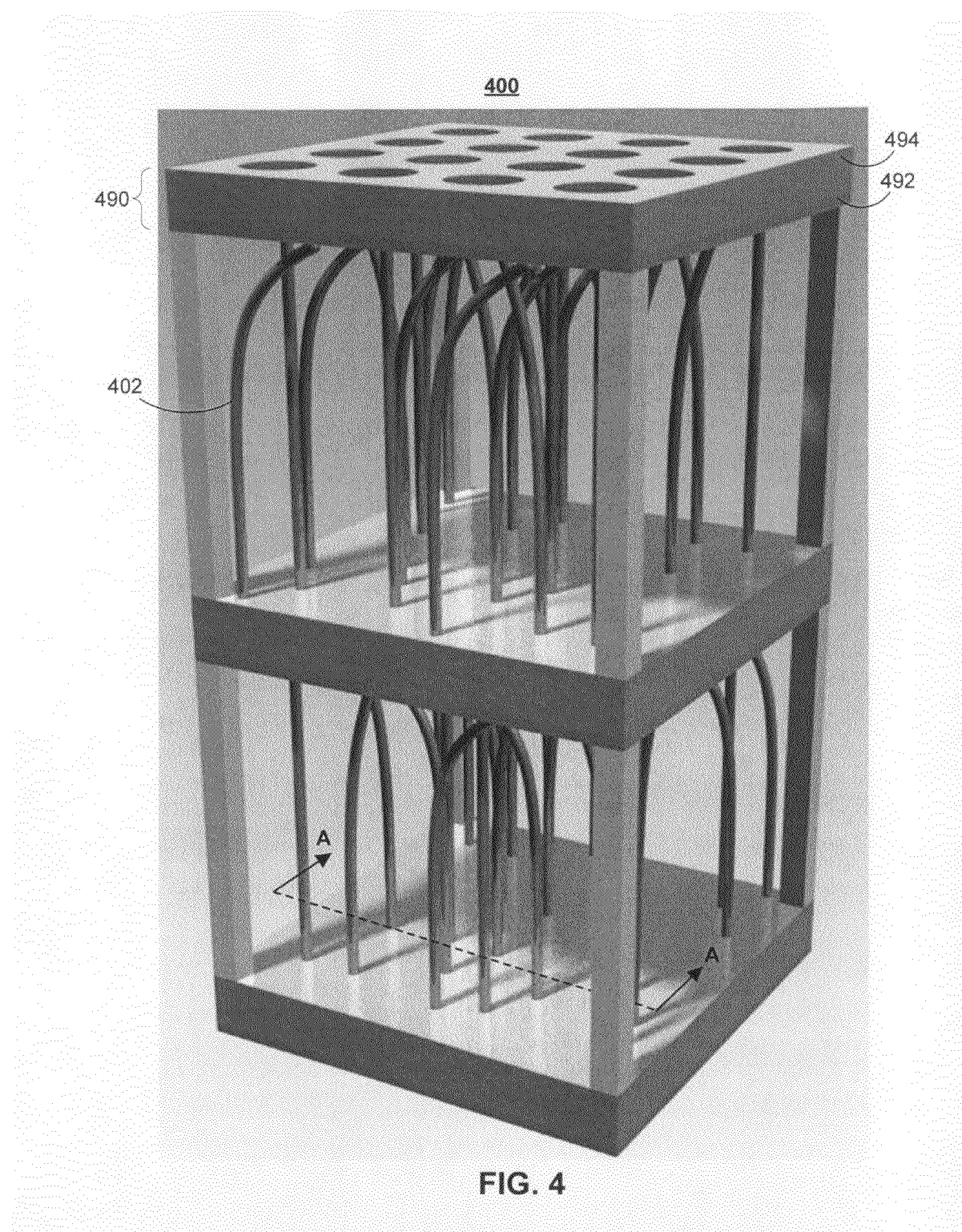
FIG. 4 is a perspective view of an illustrative nanoelectromechanical system constructed in accordance with the principles of the present invention.

In practical systems, high precision when placing metallic seeds or when placing fully grown nanowires may not be possible. For example, when dropping metallic seeds on layer 256 through the apertures in layer 294, the metallic seeds may not fall directly in the center of the apertures. Also, more than one metallic seed may be dropped into each aperture. FIG. 4 is a perspective view of NEM system 400 that may be similar to NEM system 200, except that NEM system 400 includes manufacturing variations and imperfections. For example, NEM system 400 may include additional nanowires that are not aligned within an aperture. In particular, NEM system 400 includes nanowire 402, which does not extend through any of the apertures in conductive layer 492. Nanowire 402 may therefore bend and maintain constant contact with insulating layer 492 of plate 490. Insulating layer 492 may keep nanowire 402 from being electrically coupled to conductive layer 494, and therefore prevents a short circuit between conductive layer 456 and conductive layer 494. Accordingly, having additional nanowires in NEM system 400 does not negatively influence the operation of NEM system 400.

Due to fabrication variations, the nanowires that are aligned with the apertures in NEM system 400 may not all fall directly in the center of their respective apertures. This situation may be more readily appreciated from FIG. 5, which shows a cross-sectional view of NEM system 400 taken along line A-A in FIG. 4. NEM system 500 includes, for example, nanowire 502 aligned in aperture 503 and nanowire 504 aligned in aperture 505. Both of these nanowires are offset from the center of their respective apertures. However, clearly both nanowires may still be capable of vibrating within their apertures, and may therefore still be operable to generate power across their respective plates. Therefore, NEM system 200 may be fully operational even if manufacturing variations occur.

Figure 5:
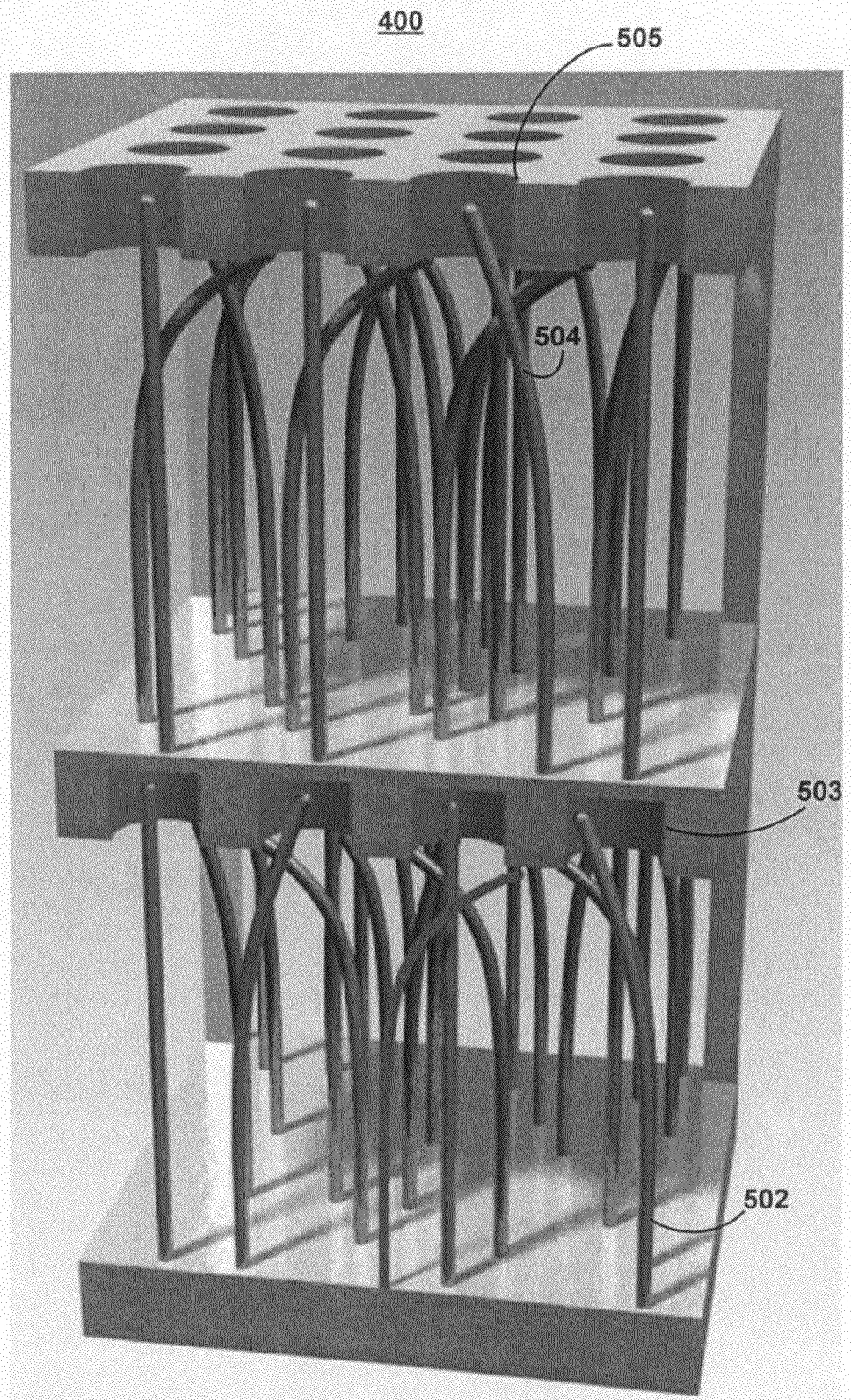
FIG. 5 is a cross-sectional view of the illustrative nanoelectromechanical system of FIG. 4, taken along line A-A.
Figure 6:
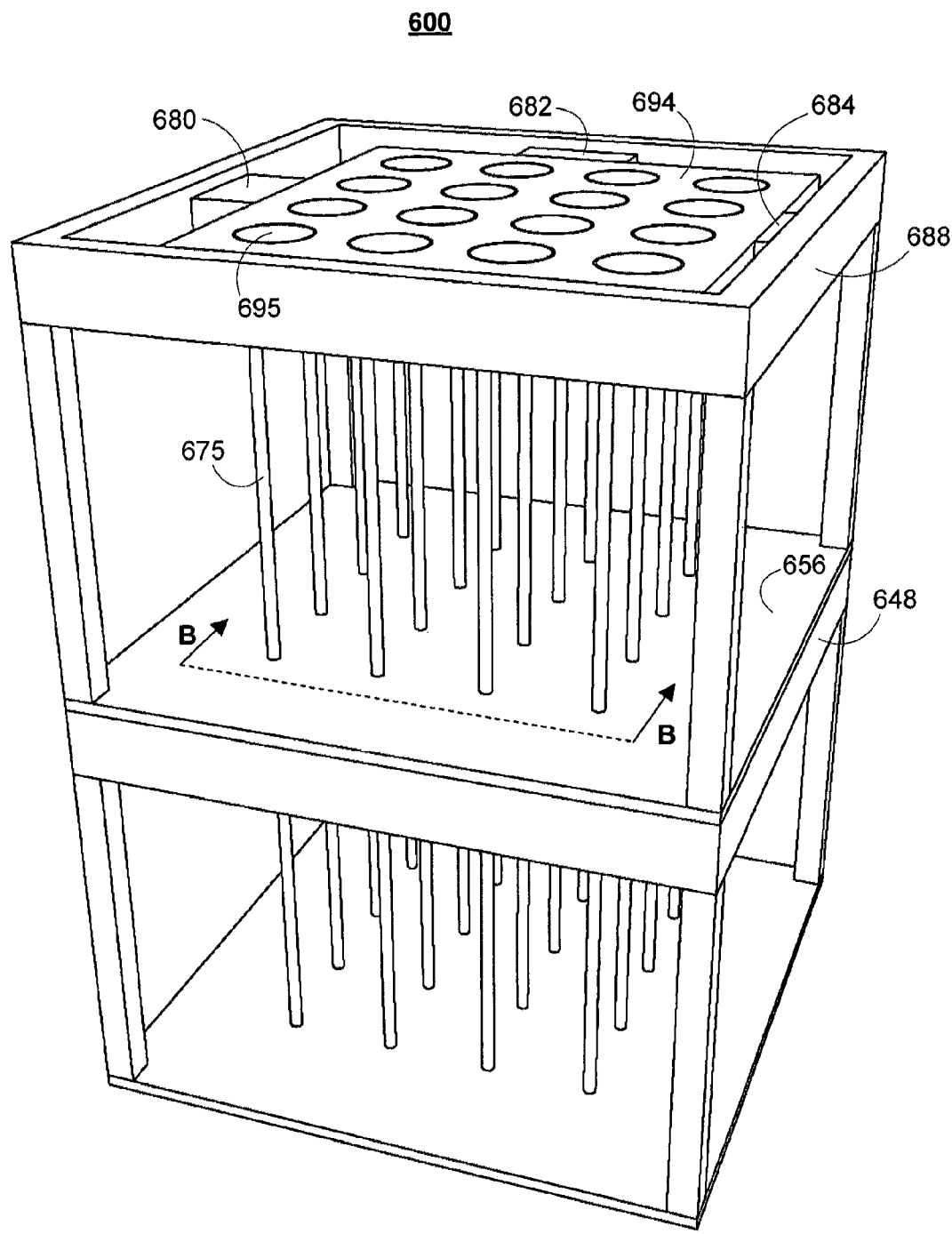
FIG. 6 is a three-dimensional perspective view of an illustrative nanoelectromechanical system constructed in accordance with the principles of the present invention.
Figure 7:
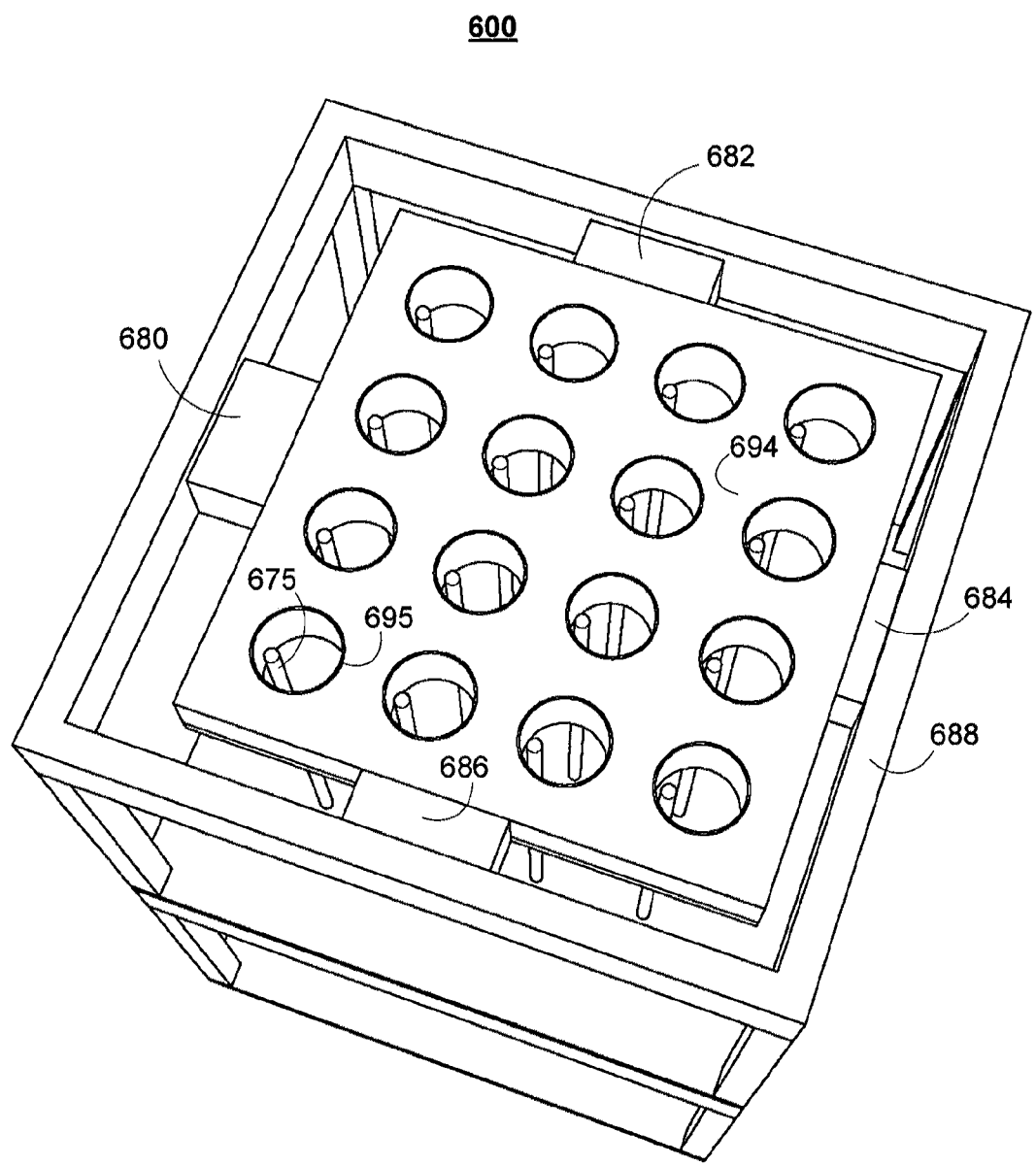
FIG. 7 is an overhead view of the illustrative nanoelectromechanical system of FIG. 6.

Referring now to FIG. 6, a perspective view of nanoelectromechanical system 600 is illustrated. NEM system 600 can have many components with similar features and functionality as those of corresponding components in NEM system 200 (FIGS. 2-4) and NEM system 400 (FIGS. 4 and 5). For convenience, each component in NEM system 600 that may correspond to another component in NEM system 200 or 500 may be similarly numbered, except that the first digit is "6" instead of "2" or "4." For example, nanowire 675 may be a nanowire with similar generator capabilities, etc., as nanowire 275 of NEM system 200.

Figure 8:
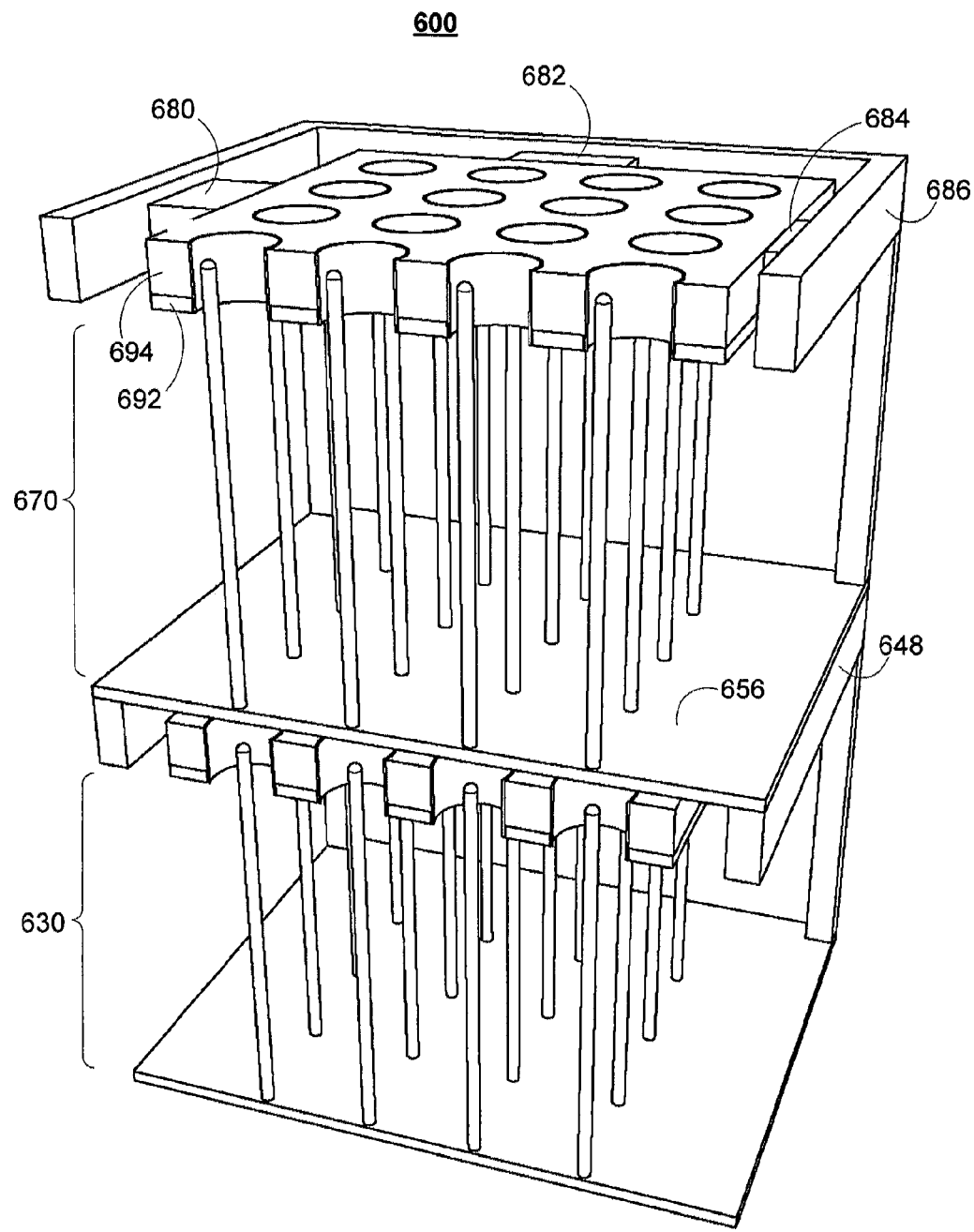
FIG. 8 is a cross-sectional view of the illustrative nanoelectromechanical system of FIG. 6, taken along line B-B.

NEM system 600 can be constructed such that the a conductive layer with apertures (e.g., conductive layer 694) may be repositioned with respect to the nanowires that extend through these apertures. For example, NEM system 600 can be constructed such that each plate includes a plurality of actuators, including actuators 680, 682, and 684. These actuators may be any suitable type of actuators, such as piezoelectric-based actuators. In some embodiments, NEM system 600 can further include control circuitry (not shown) coupled to each of these actuators for controlling the amount that the actuators are displaced. Actuators 680, 682, and 684 can be connected to different sides of conductive layer 694, and may be controlled to shift the position of only insulating layer 292 and conductive layer 694. FIG. 8 shows an overhead view of NEM system 600, which illustrates a scenario where conductive layer 696 is positioned such that the nanowires are not aligned near the center of their respective apertures. Also, as can be seen more clearly in FIG. 8, NEM system 600 can include four actuators, actuators 680, 682, 684, and 686, for moving the relative position of insulating layer 692 and conductive layer 694 with respect to the nanowires.

To provide freedom for layers 692 and 694 to be displaced, unlike in NEM system 200, layers 692 and 694 are not directly mounted to the braces (e.g., brace 620) in NEM system 600. Rather, support structures, including support structure 688, are provided in NEM system 600 and are mounted on the braces. Support structure 688, for example, may be positioned around layers 692 and 694 and can provide a mounting structure for mounting actuators. Actuators 680, 682, 684, and 686 may be mounted to each interior side of structure 688. In this way, layers 692 and 694 may be suspended at an appropriate height above layer 656, yet may be able to move with respect to layer 656. To add a third layer of nanowires to NEM system 600, a conductive layer similar to conductive layer 656 may be placed on top of support structure 688. Since this conductive layer would not be connected to actuators 680, 682, 684, and 686, the amount of displacement of layers 692 and 694 would not affect the position of nanowires grown on the next level.

Accordingly, the displacement of layers in NEM system 600 does not affect the displacement of layers in another level of NEM system 600, and each level can be displaced a different amount. This property can be more readily appreciated from FIG. 8, which shows a cross-sectional view of NEM system 600 taken across line B-B in FIG. 6. Here, the actuators mounted to support structure 648 are controlled such that the apertures in layer 652 and 654 are aligned substantially in the center of the nanowires in level 630. Actuators 680, 682, 684, and 686, on the other hand, may be controlled such that apertures in layer 692 and 694 are far offset from the center of the nanowires in level 670. Because the nanowires in level 670 are mounted to conductive layer 656, which is unaffected by the actuators mounted on support structure 648, actuators

680, 682, 684, and 686 can be controlled independently from the actuators mounted on support structure 648.

Persons skilled in the art will appreciate that a number of advantageous functionalities may be obtained by providing adjustable layers. For example, by moving an aperture with respect to a nanowire, the amount that a nanowire has to bend in order to contact an electrically conductive contact associated with the aperture may be reduced. Accordingly, moving the position of a layer (e.g., layer 294) may result in an increased or decreased rate of contact for the associated nanowires. Also, persons skilled in the art will appreciate that the position of each conductive layer having apertures may be changed in order to counter any affects of imperfect placement of nanowires. For example, if a majority of the nanowires are grown at a position that is off-center from the apertures in approximately the same direction, the actuators for the associated layer may be moved to a position where these off-center nanowires are centered within their respective apertures.

NEM systems 200, 500, and 600 (FIGS. 2-6) have been described above to be nanowire-based generators. Persons skilled in the art will appreciate that, rather than using nanowires, other nanometer-scale generators may be used. For example, NEM systems 200, 500 and 600 can have generators based on any other material with piezoelectric properties.

NEM systems 200, 500, and 600 (FIGS. 2-8) have also been described above to be used for generating power. This is merely illustrative. Persons skilled in the art will appreciate that these NEM systems constructed according to the principles described in connection with FIGS. 2-6 can be used as switches, sensors and pumps. For example, each nanometer-scale beam in NEM systems 200, 500, or 600 may be a carbon nanotube that vibrates and achieves a contact rate based at least partially on the external temperature. Changes in temperature can be detected by detecting changes in contact rate, or by detecting another property (e.g., current flow) that depends on the contact rate. Therefore, NEM systems 200, 500, and 600 can be used as a temperature sensor or a sensor for another external condition.

Figure 9:
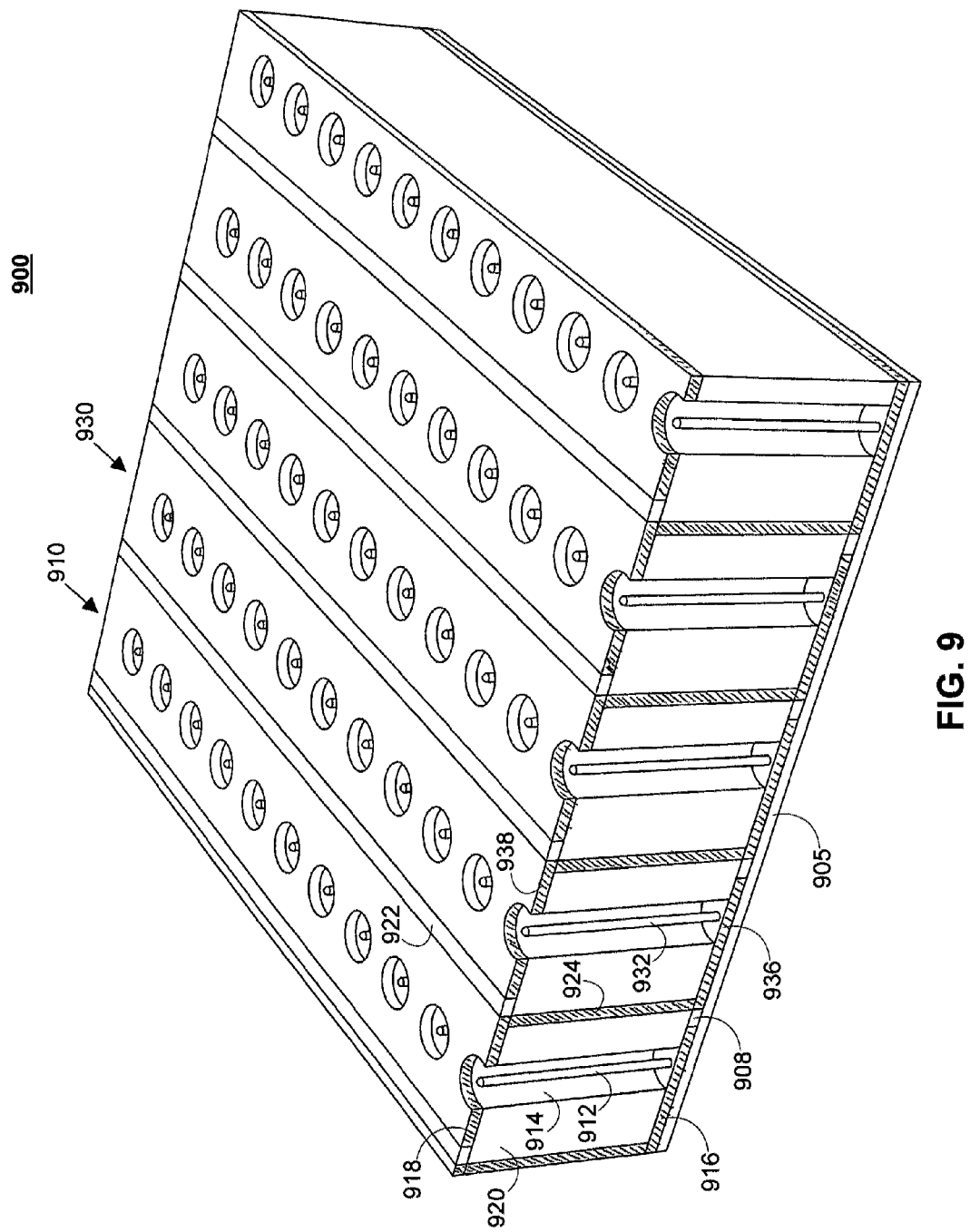
FIG. 9 is a three-dimensional perspective view of an illustrative nanoelectromechanical system constructed in accordance with the principles of the present invention.

Referring now to FIG. 9, a perspective view of nanoelectromechanical system 900 is shown that includes a plurality of vertical beam-based generators, where the beams may be nanowires (e.g., zinc-oxide nanowires). In NEM system 900, each beam-based generator is formed within a cylindrical channel. For example, the beam-based generator constructed based on nanowire 912 may be formed within cylindrical channel 914. Here, nanowire 912 may be grown or placed on conductive layer 916, and nanowire 912 may extend perpendicularly from conductive layer 916 through channel 914. Channel 914 may be formed into insulating layer 914 and conductive layer 918, where insulating layer 914 may be used to electrically isolate conductive layer 916 from conductive layer 918. Nanowire 912 may be operable to generate an electric potential when nanowire 912 vibrates, and can provide this generated electric potential as a voltage across conductive layers 916 and 918 when nanowire 912 vibrates and comes into contact with conductive layer 918 within channel 914 at a contact rate.

NEM generator 900 can have similar advantageous features as NEM system 200 of FIG. 2, and may operate under the same principles as NEM system 200. For example, because channel 914 is cylindrical and completely surrounds nanowire 914, nanowire 914 may contact conductive layer 918 when nanowire 914 vibrates regardless of the angle that nanowire 914 bends. Also, because channel 914 can extend completely through conductive layer 918, nanowire 912 is not limited to any particular height. Nanowire 912 can be grown to be approximately the same height as channel 914, or nanowire 912 can be grown such that nanowire 912 protrudes from channel 912. Regardless, nanowire 912 may be operable to generate an electric potential and provide this electric potential to conductive layer 918 when nanowire 912 vibrates.

Persons skilled in the art will appreciate that NEM system 900 can have other advantageous features in addition to those of NEM system 200. In particular, providing channels for growing beams may allow for a more sturdy and stable nanometer-scale structure. Also, the channels may prevent nanowires from getting tangled with one another, and can ensure that each nanowire is able to generate power.

A plurality of nanowires, including nanowire 912, may be grown on conductive layer 916 and extend through a channel formed through insulating layer 914 and conductive layer 918. More particularly, all of the nanowires illustrated in row 910 extend through such a channel and are operable to provide power across conductive layers 916 and 918. Therefore, row 910 may be viewed as having a plurality of beam-based generators coupled in parallel. Similarly, row 930 includes a second plurality of beam-based generators coupled in parallel. That is, row 930 includes a plurality of nanowire-based generators, where each nanowire is grown on conductive layer 936, extends through a channel formed through insulating layer 940 and conductive layer 938, and is operable to provide a voltage across conductive layers 936 and 938. Persons skilled in the art will appreciate that more than one nanowire may be provided in each channel for generating power between conductive layers 936 and 938.

The nanowire-based generators of row 910 are electrically coupled in series with the nanowire-based generators of row 930. More particularly, conductive layer 924 may be provided between insulating layer 914 of row 910 and insulating 940 of row 930. Conductive layer 924 may connect conductive layer 918 to conductive layer 936. Therefore, the electric potential generated by the nanowire-based generators in row 910 is provided to the base of the nanowire-based generators in row 930. The electric potential at conductive layer 938 is equal to the sum of the electric potential produced by the generators of row 910 and the electric potential produced by the generators of row 930. To ensure that the base of the row 910 is isolated from the base of row 930, isolation layer 908 may be formed between conductive layer 916 and conductive layer 918. Similarly, isolation layer 922 may be provided between conductive layer 918 and conductive layer 938 to electrically isolate these layers. Isolation layers may be made of any type of insulating or nonconductive material.

Figure 10:
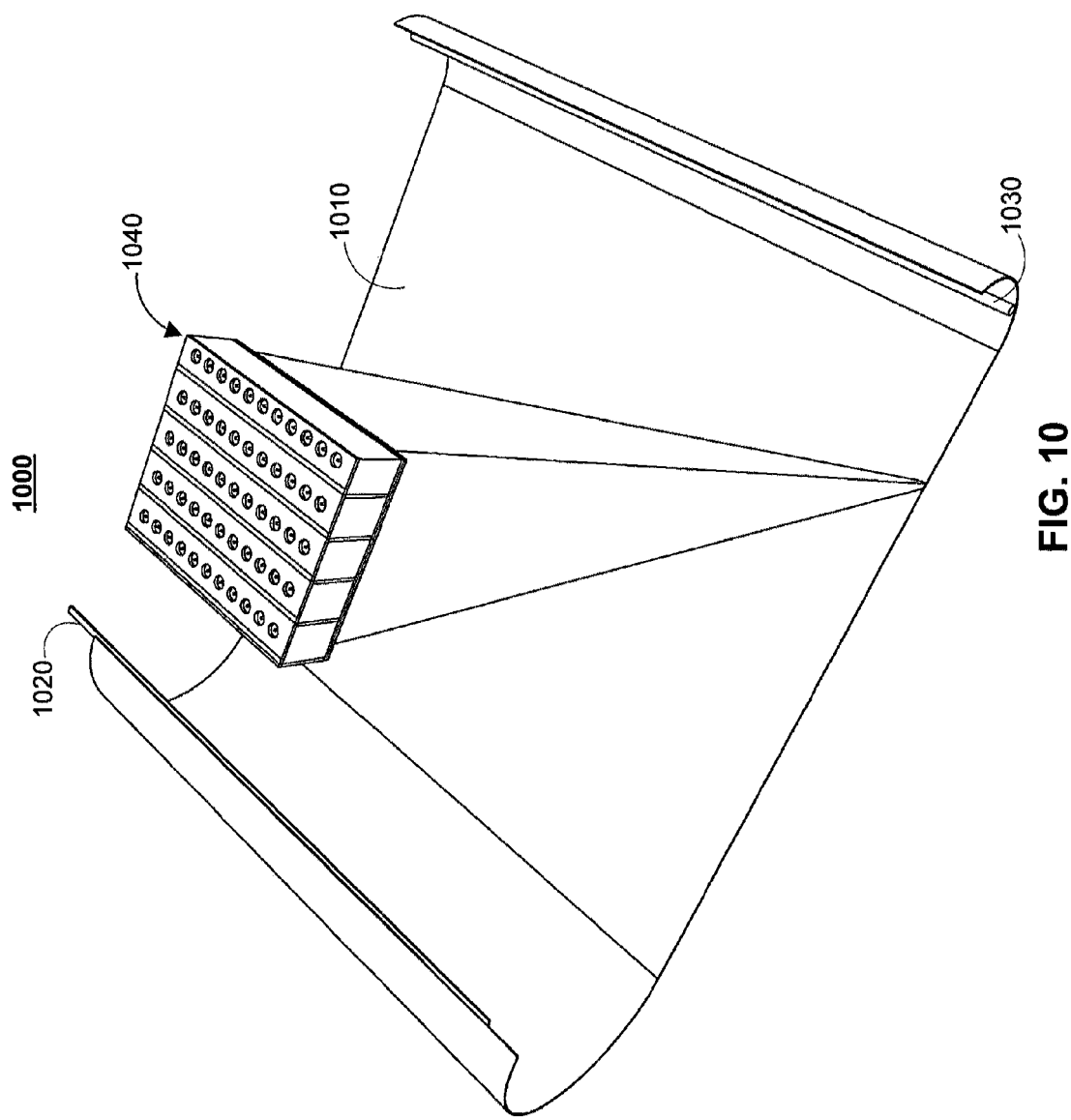
FIG. 10 is a three-dimensional view of an unrolled battery constructed with the principles of the present invention.

Any suitable number (e.g., billions or trillions) of nanowire-based generators may be fabricated using the principles illustrated in FIG. 9 to create a nanoelectromechanical system that can generate a useful amount of power. Turning to FIG. 10, NEM system 1000 is shown that can include billions or trillions of generators. In particular, NEM system 1000 includes a layer that is formed completely or almost completely of generators constructed in accordance with the principles described in connection with FIG. 9. For example, generator section 1040 shows a blown up view of a small portion of layer 1010, where generator section 1040 may be essentially the same as NEM system 900 of FIG. 9. The remaining portions of layer 1010 may be similar to generator section 1010.

NEM system 1000 can include electrical contacts 1020 and 1030, which are connected to opposite ends of layer 1010. The voltage produced by the generators of layer 1010 may be provided across electrical contacts 1020 and 1030. That is, electrical contact 1020 may be connected to the base of the first row of parallel generators, and electrical contact 1030 may be connected to the output of the final row of parallel generators. Therefore, the sum of the electric potential produced by all of the parallel generators may be accumulated and provided across electrical contact 1020 and electrical contact 1030.

Figure 11:
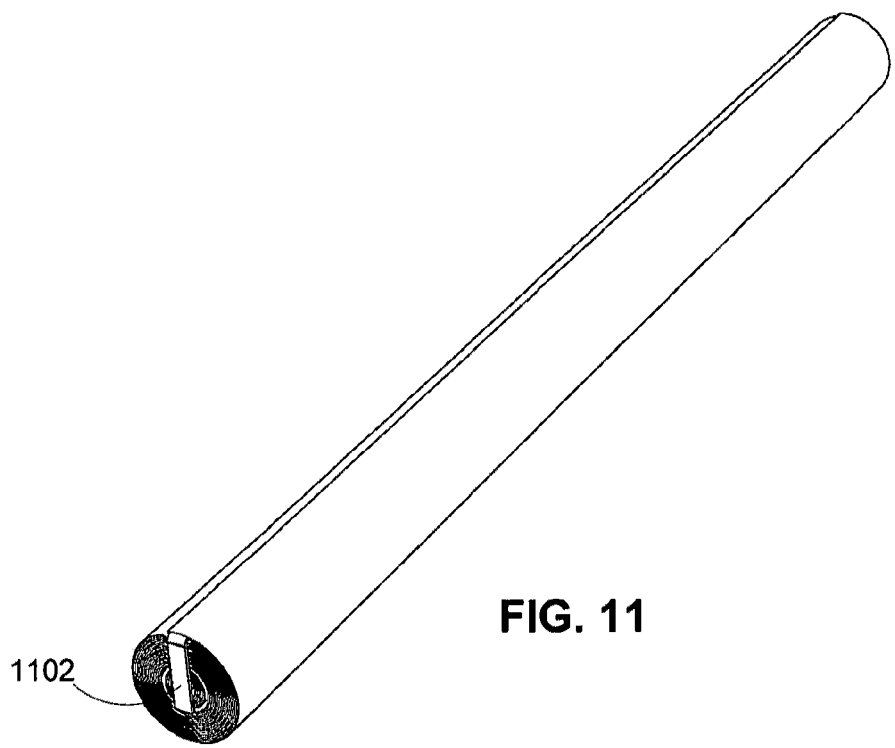
FIG. 11 is a three-dimensional battery, viewed from one end, constructed in accordance with the principles of the present invention.
Figure 12:
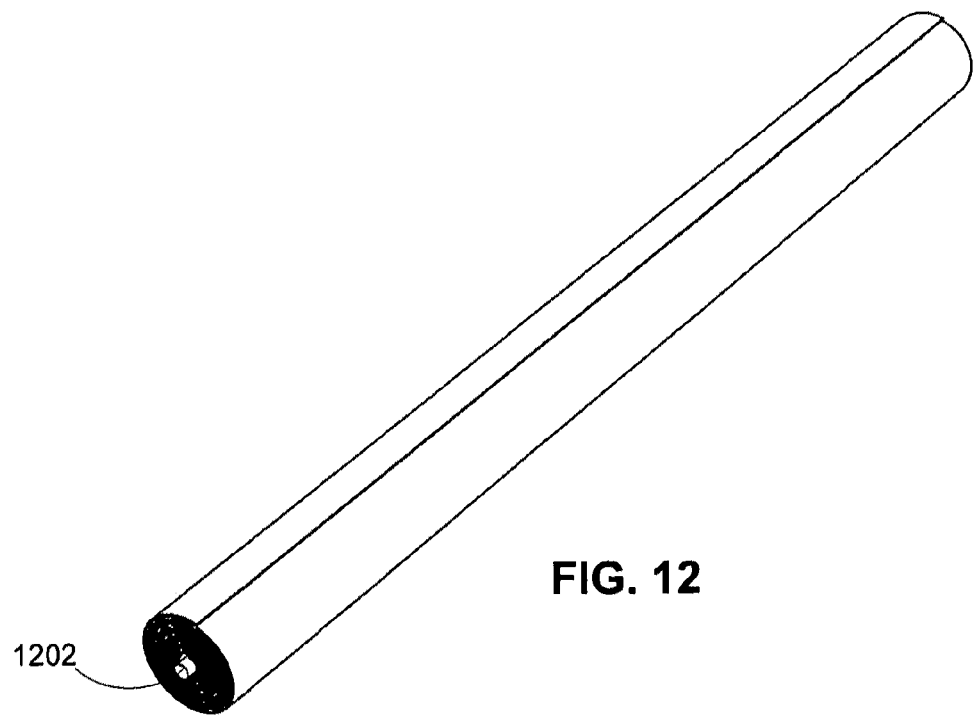
FIG. 12 is the battery of FIG. 11, viewed from the other end.

NEM system 1000 may be rolled into a cylinder and used as a battery. In this scenario, electrical contacts 1020 and 1030 may function as the terminals of the battery. For example, NEM system 1000 may be rolled such that one end has flat terminal 1102, as shown in FIG. 11, and the other end has protruding terminal 1202, as shown in FIG. 12. As such, the cylinder formed by rolling NEM system 1000 may take the form of a battery such as, for example, an A, AA, AAA, B, C, D, or any other sized battery. Person skilled in the art will appreciate that such a battery may, for example, utilize beam-based generators to convert heat, and other sources of mechanical vibrations, into electricity.

Persons skilled in the art will appreciate that a battery is only one of many uses of a NEM system constructed according to the principles described above in connection with FIG. 9. For example, a NEM system similar to NEM system 900 may be used as sensor. Also, persons skilled in the art will appreciate that the beam-based generators of FIGS. 9-12 may be based on beams other than nanowires, such as nanotubes or other piezoelectric elements.

Figure 13:
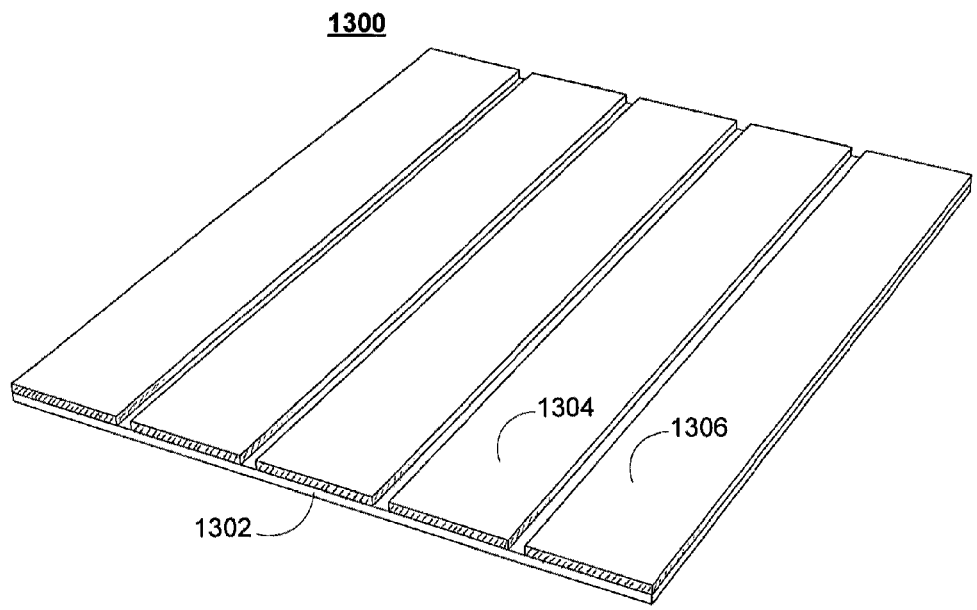
FIGS. 13-22 illustrate exemplary perspective cross-sectional views of the nanoelectromechanical system of FIG. 9 in various stages of fabrication.

FIGS. 13-22 illustrate exemplary cross-sectional views of the nanoelectromechanical system of FIG. 9 in various stages of fabrication Referring first to FIG. 13, package 1300 is shown including a first plurality of conductive layers provided on substrate 1302. For example, conductive layer 1304 and conductive layer 1306 may be provided on substrate 1302. The first plurality of conductive layers, including conductive layers 1304 and 1306, may be metal layers composed of aluminum, tin, copper, or tungsten, or may be dielectric layers such as polysilicon, for example. Substrate 1302 may be nonconductive, or may be a semiconductor. Conductive layers 1304 and 1306 may be provided on substrate 1302 using any suitable fabrication technique, such as by selective disposition, sputter deposition, plasma vapor deposition, or a chemical vapor deposition (CVD), for example.

Figure 14:
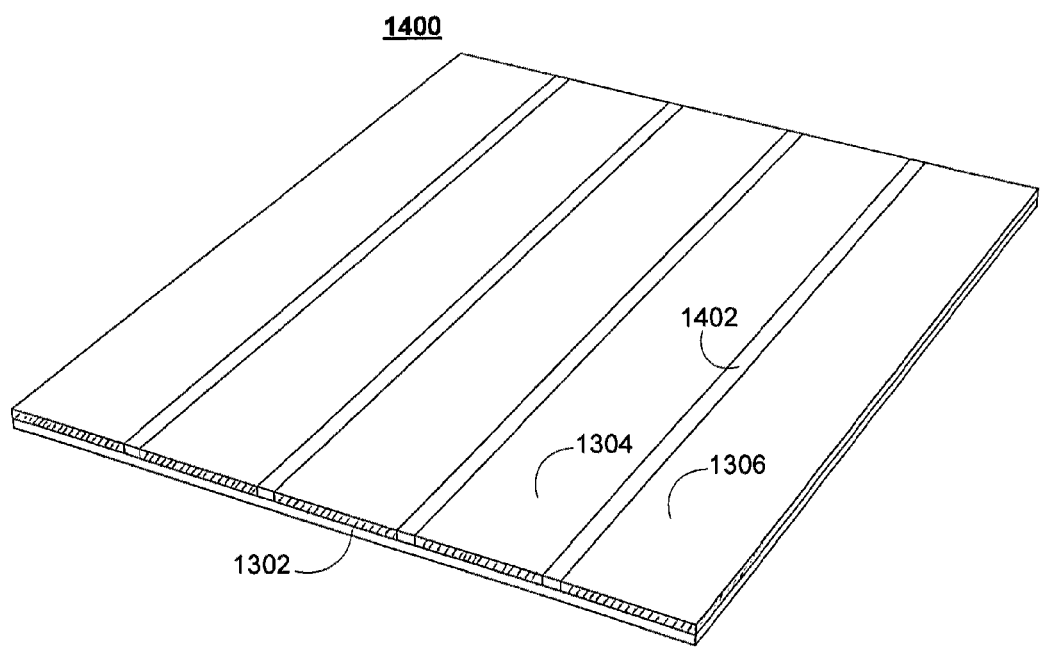

FIG. 14 shows a perspective cross-sectional view of package 1400, where a first plurality of isolation layers are deposited on substrate 1302. Each of the isolation layers may be placed between a pair of the conductive layers that were provided on package 1300. For example, isolation layer 1402 may be deposited in between conductive layer 1304 and conductive layer 1306. Isolation layer 1402 can be made of any suitable type of material that electrically insulates conductive layer 1304 from conductive layer 1306, such as an oxide layer or silicon dioxide.

Figure 15:
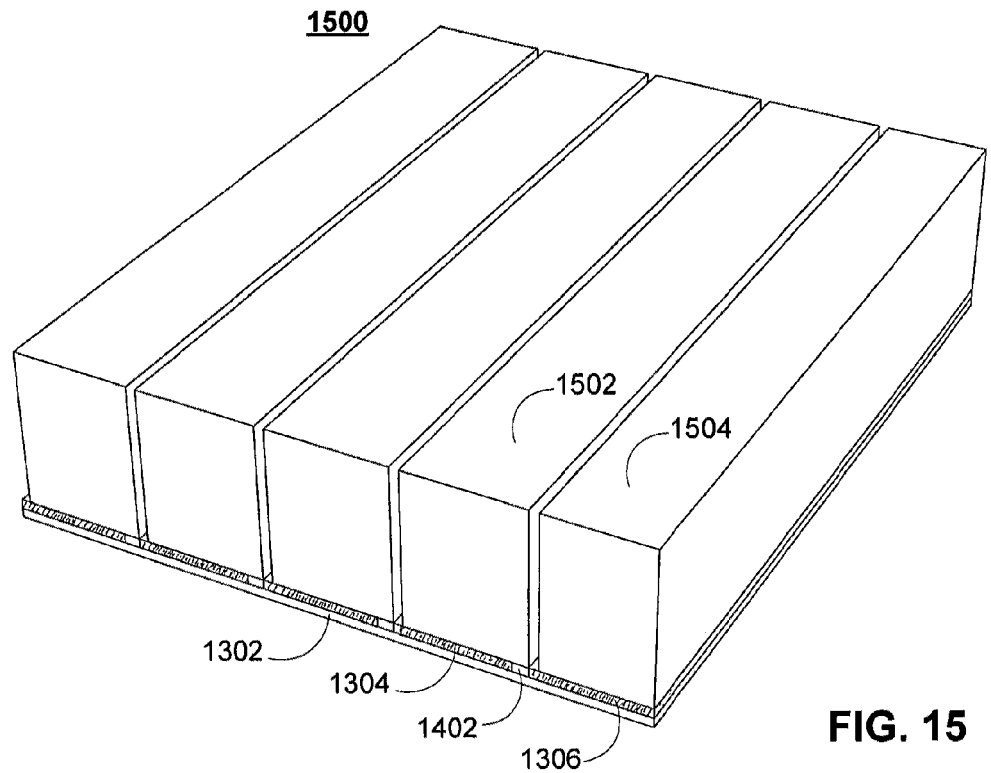

Turning to FIG. 15, package 1500 is shown in which a plurality of insulating layers has been deposited on the first plurality of conductive and isolation layers. More particularly, insulating layer 1502 may be deposited on conductive layer 1304 and isolation layer 1402, and insulating layer 1504 may be deposited on conductive layer 1305. Insulating layers 1502 and 1504 may be made of the same or a different material as isolation layer 1402. Insulating layers 1502 and 1504 may be deposited such that only a portion of conductive layer 1306 is left exposed between these insulating layers.

Figure 16:
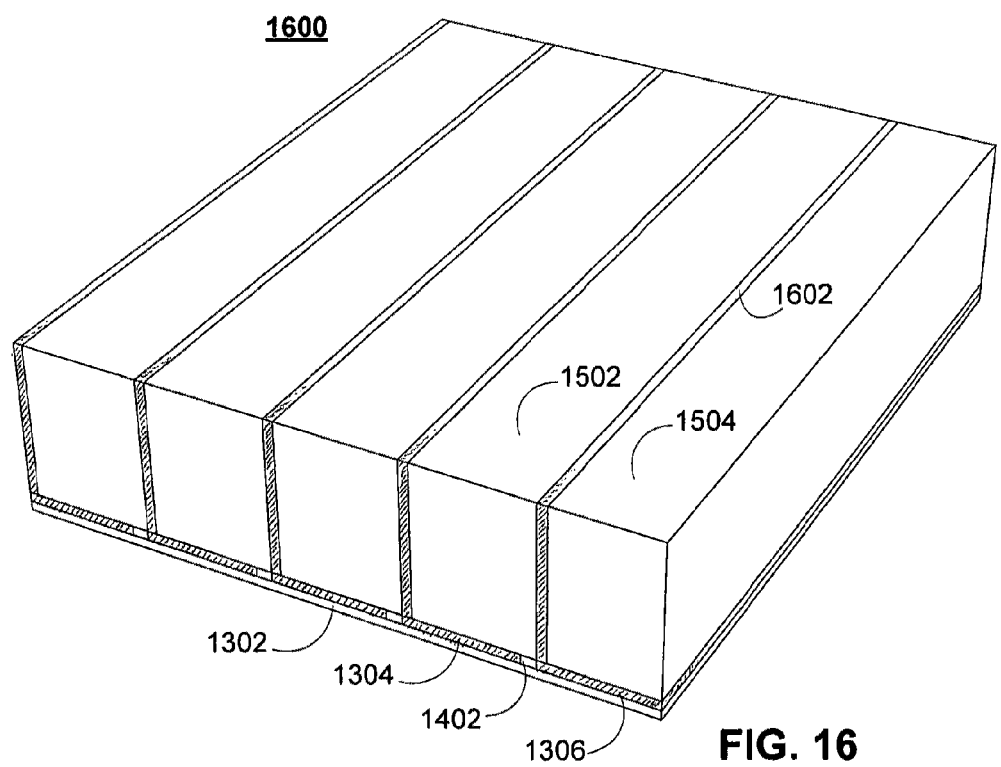

Moving to FIG. 16 and package 1600, a second plurality of conductive layers may be provided in package 1600 and placed between the insulating layers. For example, conductive layer 1602 may be placed between insulating layer 1502 and insulating layer 1504, and may be electrically coupled to conductive layer 1306. Conductive layer 1602 can be the same or a different material than conductive layers 1304 and 1306, and can be shaped and placed using the same or a different process than that used on conductive layers 1304 and 1306. Conductive layer 1602 may be placed in a perpendicular orientation relative to conductive layers 1304 and 1306. In some embodiments, conductive layer 1602 may have the same shape and thickness as conductive layers 1304 and 1306, and could have been used instead as conductive layers 1304 and 1306.

Figure 17:
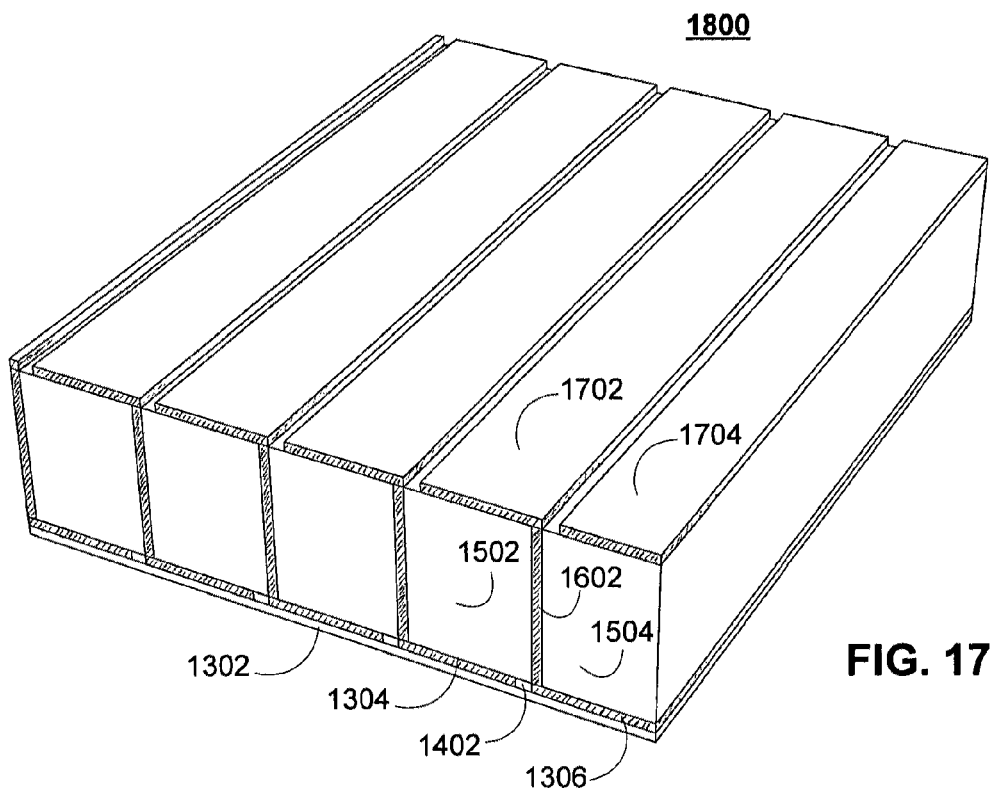

FIG. 17 shows a perspective cross-sectional view of package 1700, which includes a third plurality of conductive layers placed on top of the insulating layers and the second plurality of conductive layers. In particular, conductive layer 1702 may be placed on top of insulating layer 1502 and conductive layer 1602, and therefore conductive layer 1702 may be electrically coupled to both conductive layer 1502 and conductive layer 1306. Conductive layer 1704 may be placed on top of insulating 1504. Conductive layers 1702 and 1704 may be placed such that a portion of insulating layer 1602, but not conductive layer 1602, is left exposed between conductive layers 1702 and 1704. These conductive layers may be the same or a different material than conductive layers 1304 and 1306 or conductive layer 1602, and may be shaped and placed using the same or a different process than that used on these conductive layers. In some embodiments, conductive layers 1702 and 1704 may be created such that conductive layers 1702 and 1704 could have been used as conductive layers 1304 and 1306 and/or conductive layer 1602.

Figure 18:
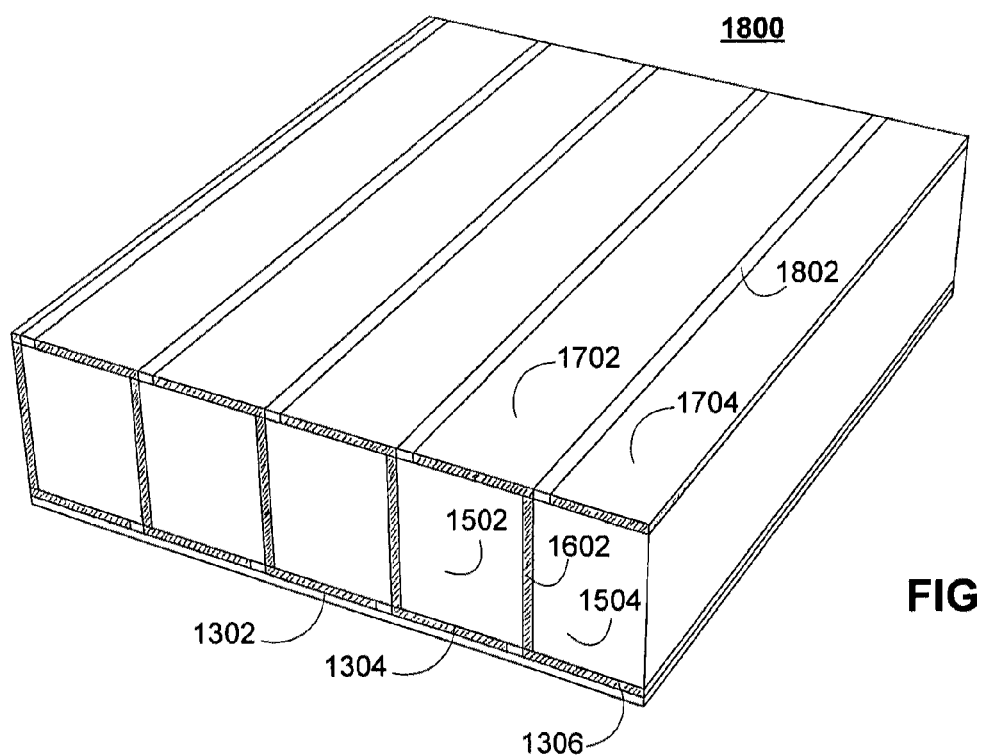

Turning to FIG. 18, package 1800 is shown including a second plurality of isolation layers that are placed between the conductive layers. The second plurality of isolation layers can include isolation layer 1802, which can be placed in between conductive layers 1702 and 1704. Isolation layers 1802 may be made of the same or different material as isolation layers 1402, and isolation layer may be provided to the NEM system using the same or a different process as isolation layer 1402. In some embodiments, isolation layers 1802 may be created such that isolation layers 1802 could have been used as isolation layers 1402, and vice versa.

Figure 19:
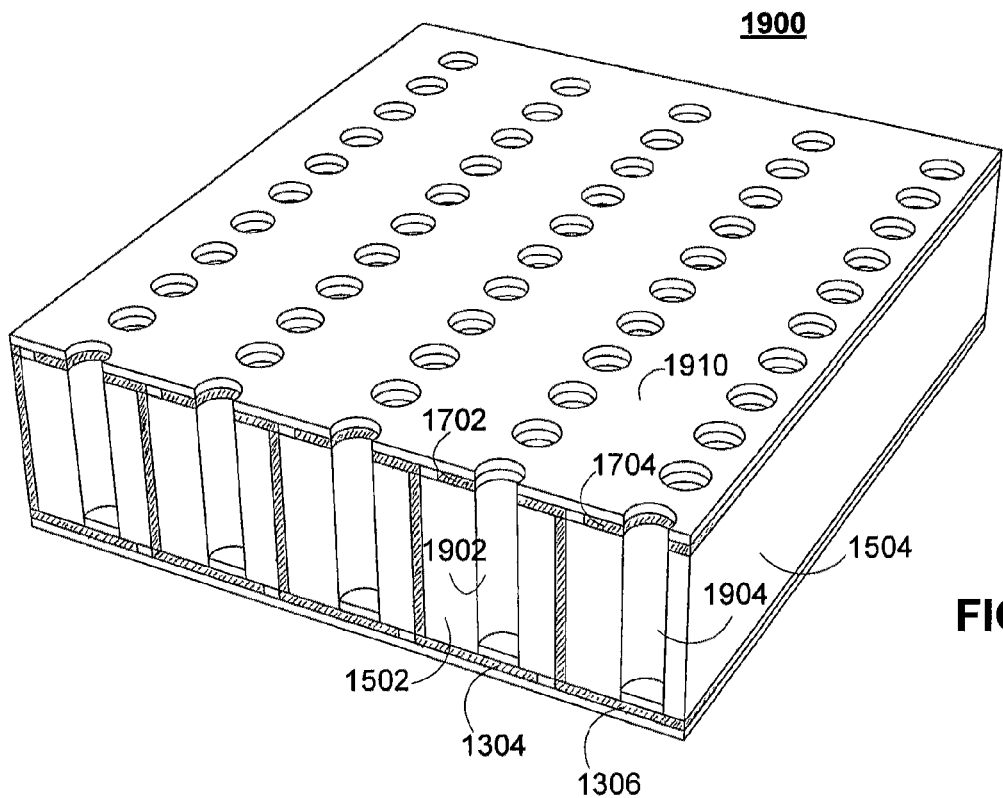

Moving to FIG. 19, package 1900 is shown in which a plurality of channels, such as channels 1902 and 1904, have been formed into the third plurality of conductive layers and the insulating layers. Channel 1902, for example, may be formed into conductive layer 1702 and insulating layer 1502, and channel 1904 may be formed into conductive layer 1704 and insulating layer 1504. Channels 1902 and 1904 may be formed all the way through these layers, leaving a portion of conductive layer 1304 and a portion of layer 1306 exposed. The channels may be formed using any suitable cutting or drilling approach.

FIG. 19 further illustrates mask 1910, which is provided on all of the exposed surfaces of the NEM system fabricated thus far. Accordingly, mask 1910 may be provided on the second plurality of isolation layers (e.g., isolation layer 1802), the third plurality of conductive layers (e.g., conductive layers 1702 and 1704), and the exposed portions of the first plurality of conductive layers (e.g., conductive layers 1304 and 1306). Mask 1910 can be made of any of a variety of material that may be easily removed from the package.

Figure 20:
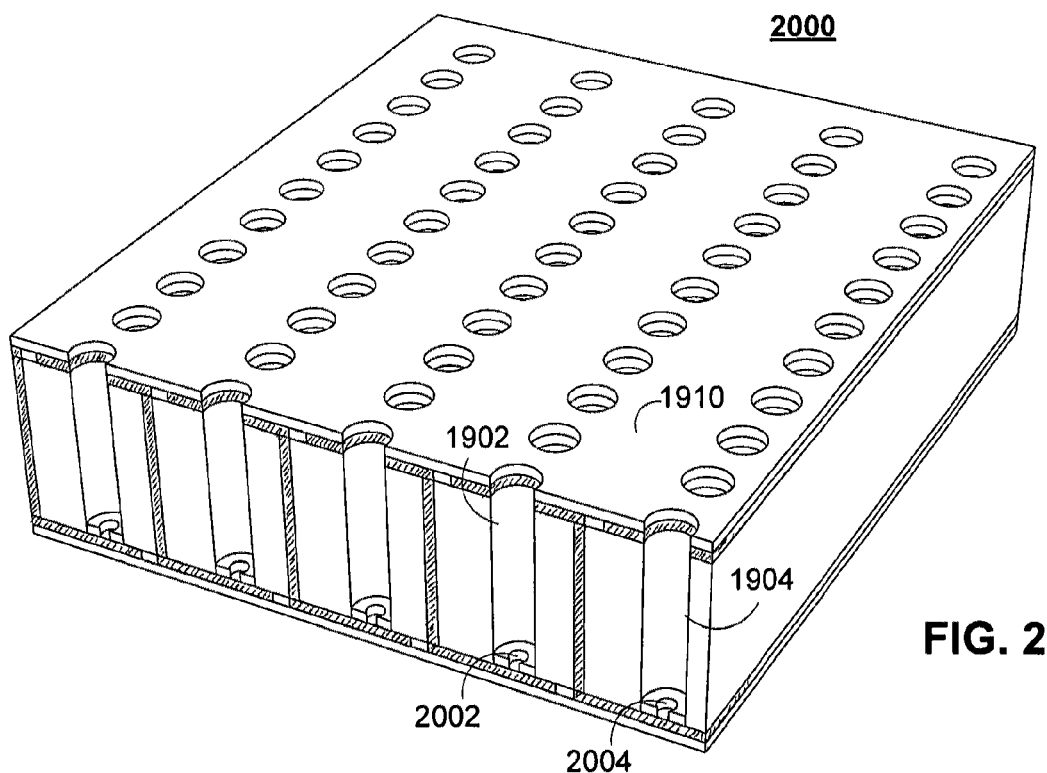

FIG. 20 shows a perspective cross-sectional view of package 2000, where portions of mask 1910 where nanometer-scale beams are desired have been cut away. To allow a single nanometer-scale beam to grow in each channel, a hole may be provided through mask 910 at the center of each channel. For example, hole 2002 may be cut through mask 910 at the center of channel 1902, and hole 2004 may be cut through mask at 910 at the center of channel 1904. Holes 2002 and 2004 may expose a small portion of conductive layers 1304 and 1306, respectively, that may be just large enough to allow one metallic seed to fall through.

Figure 21:
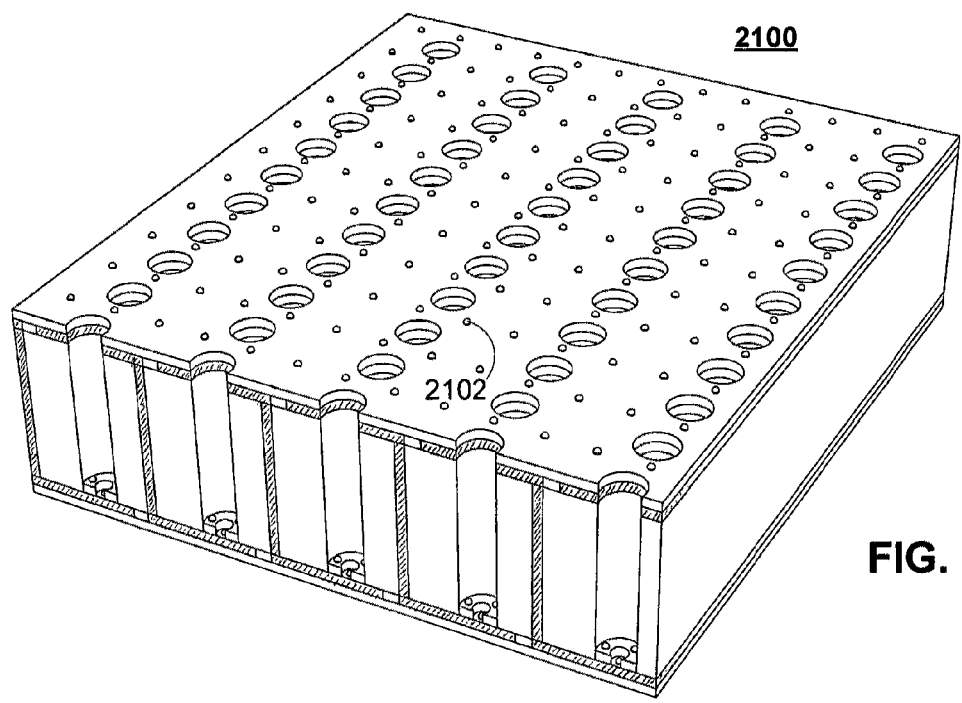

Turning to FIG. 21, package 2100 is shown including a plurality of metallic seeds, such as metallic seed 2102, that are dropped onto the nanoelectromechanical system fabricated thus far. Some of the metallic seeds may fall onto mask 1910, either on a portion of mask 1910 within a channel or on a portion of mask 1910 outside of a channel. Due to the size of holes 2002 and 2004 in mask 1910, one metallic seed may be dropped through each of holes 2002 and 2004 and onto conductive layers 1304 and 1306, respectively.

Figure 22:
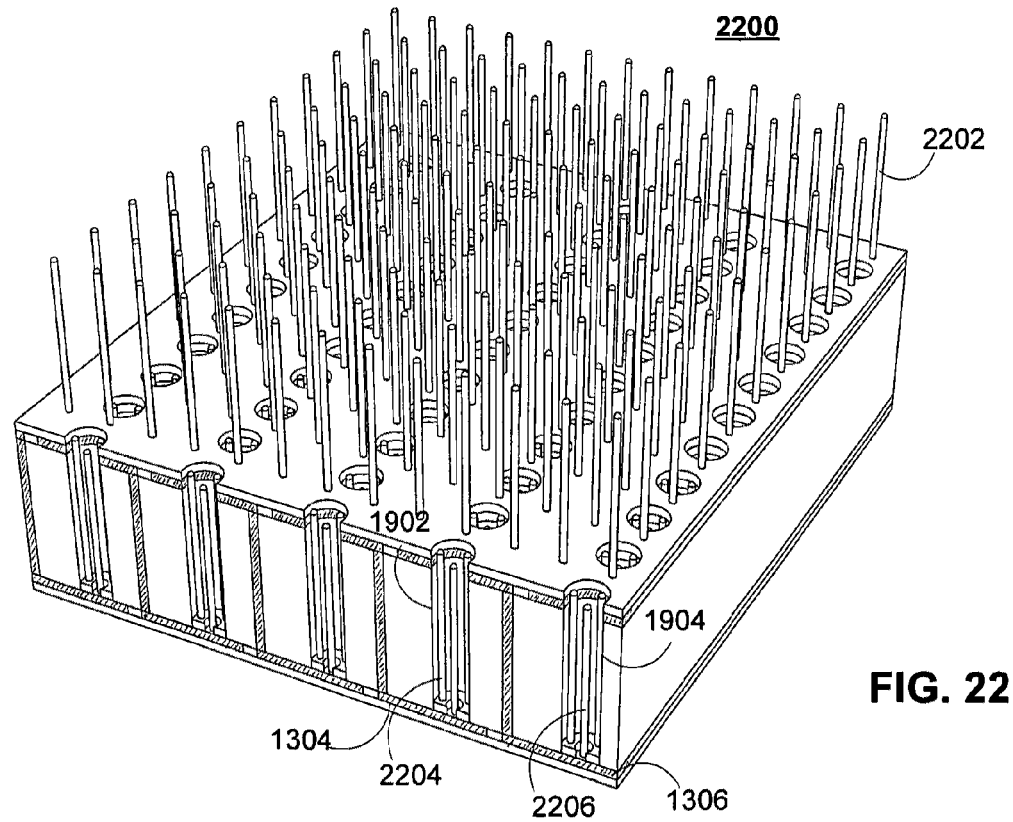

Moving to FIG. 22, a perspective cross-sectional view of package 2200 is shown, where nanometer-scale beams, such as nanowires, have been grown from the metallic seeds. The beams may be grown to an appropriate height, such as a height roughly corresponding to the height of the channels. Once the beams are grown the appropriate height, mask 1910 may be removed. The nanowires growing on mask 1910 may be removed with mask 1910, leaving only one beam in roughly the center of each of the channels. For example, beam 2202 grown outside of any channels and beam 2204 grown within channel 1902 may be removed with mask 1910, while beam 2206 may remain in the center of channel 1904. In particular, beam 2206 may remain in the center of channel 1904, and is coupled to conductive layer 1306 and extends vertically through channel 1904. The resulting NEM system may be similar to NEM system 900 of FIG. 9.

Persons skilled in the art will appreciate that any of a variety of types of nanometer-scale beams may be grown on mask 1910 in packages 2100 and 2200. For example, the beams may be carbon nanotubes or other piezoelectric elements. Persons skilled in the art will also appreciate that the beams may be grown on a different substrate and then attached to packages 2100 and 2200. Moreover, persons skilled in the art will also appreciate that some of the techniques used for making NEM system 900 may be applied for fabricating NEM systems 200, 500, and 600 (FIGS. 2-8).

The operation of a nanoelectromechanical system constructed in accordance with the principles of the present invention may be affected by the presence of an electric field. For example, an electric field generator may be provided in any of NEM systems 100, 200, 400, 600, 900, and 1000 (FIGS. 2-10), which may affect the contact rate of the nanowires in each of the generators. Thus, by controlling the intensity and/or direction of the electric field generator, the direction and/or amount of power generated by these nanoelectromechanical systems can be controlled.

Figure 23:
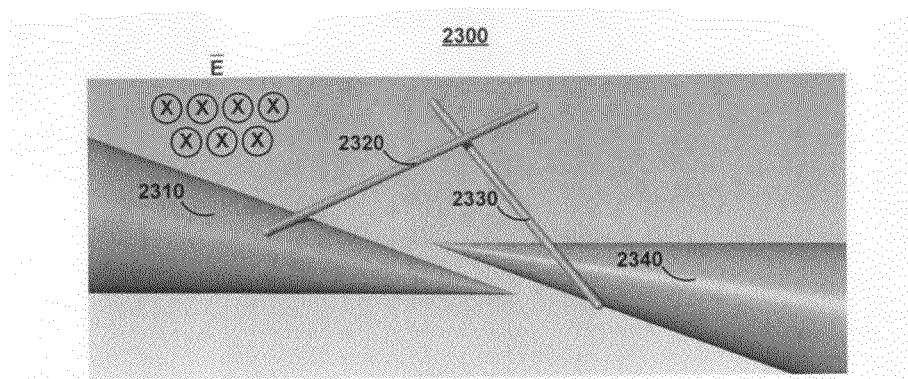
FIGS. 23-25 are two-dimensional views of nanometer-scale test structures that can be used to illustrate the operation of various principles of the present invention.
Figure 24:
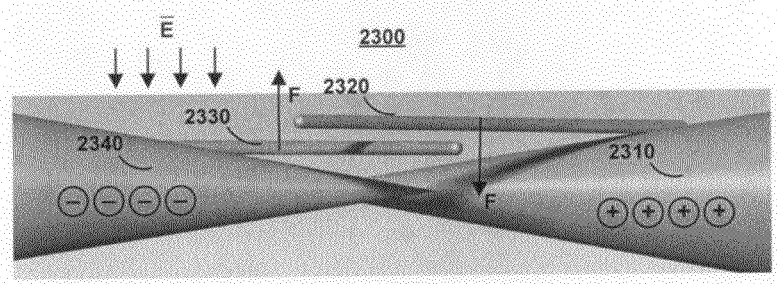
Figure 25:
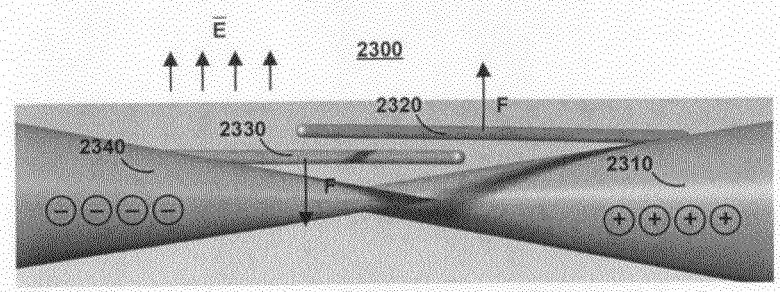

FIGS. 23-25 more clearly illustrate the effect an electric field can have on nanometer-scale beams. As will become apparent below in FIGS. 26-37, this effect can be utilized to construct useful nanoelectromechanical structures. Turning first to FIG. 23, NEM test system 2300 is shown with nanometer-scale beam 2320 and nanometer-scale beam 2330. Beams 2320 and 2330 may be, for example, nanotubes that are electrically conductive. Beams 2320 and 2330 may be positioned in a crisscross manner where beams 2320 and 2330 are not touching one another. Beams 2320 and 2330 may also be placed in the presence of an electric field that is pointing in a direction perpendicular beams 2320 and 2330 from beam 2320 to beam 2330. Nanometer-scale beams 2320 and 2330 may be contacted by probes 2310 and 2330, respectively. In FIG. 23, probes 2310 and 2330 may not be electrically charged, and therefore nanometer-scale beams 2320 and 2330 may also be uncharged. In this scenario, no force from the electric field may be applied to beams 2320 and 2330, and beams 2320 and 2330 may remain at their respective resting positions.

Referring now to FIG. 24, NEM test structure 2300 is again shown, only at a perspective where the electric field is pointing from top to bottom. In FIG. 24, probe 2340 may be provided with a negative charge and probe 2310 may be provided with a positive charge. Once these opposite charges are transferred to beams 2330 and 2320, respectively, the electric field may exert a force on beams 2330 and 2320. More particularly, the downward electric field may exert an upward force on the negatively charged beam 2330, causing beam 2330 to move in a direction towards beam 2320. The downward electric field may exert a downward force on the positively charged beam 2320, causing beam 2320 to move in a direction towards beam 2330. These forces may be in addition to the attractive forces that the opposite charges on beams 2320 and 2330 have on each other. Thus, in the operating scenario illustrated by FIG. 23, the electric field may cause beams 2320 and 2330 to come into contact with each other, allowing current to flow from probe 2340 to probe 2310.

The opposite effect (e.g., a repelling force) may be achieved by changing the direction of the electric field. This scenario is illustrated in FIG. 25, which shows NEM test structure 2300 from the same perspective as in FIG. 24 but with an electric field pointing upwards. Once probe 2330 provides a negative charge to beam 2330 and probe 2310 provides a positive charge to beam 2320, the electric force may exert forces on beams 2330 and 2320 to drive beams 2330 and 2330 apart. That is, the upward electric field may exert a downward force on the negatively charged beam 2330 and an upward force on the positively charged beam 2320. Depending on the strength of the electric field and the amount of charge on beams 2330 and 2320, the force exerted by the presence of the electric field may force beams 2330 and 2330 apart, may cancel out the attracting forces of having opposite charges on beams 2320 and 2330, or may not exert a strong enough force to counter the attractive forces of the opposite charges. Thus, by controlling the direction and intensity of the electric field, beams 2330 and 2330 can be influenced to move towards or apart from each other.

Figure 26:
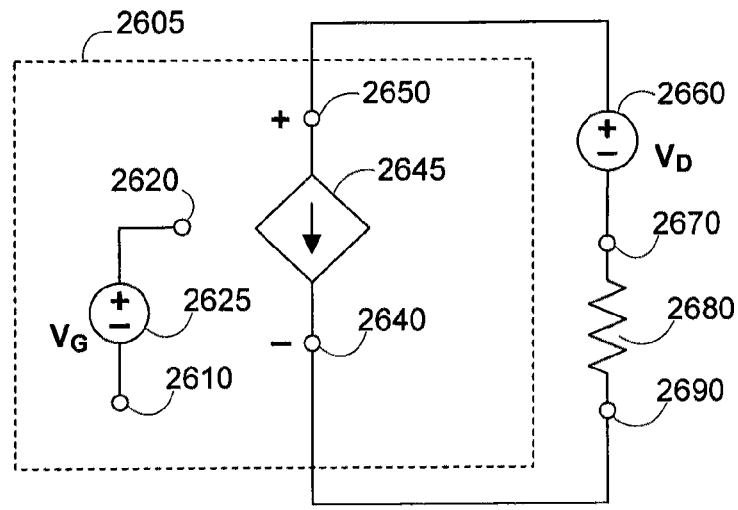
FIG. 26 is a circuit schematic diagram of a nanoelectromechanical system constructed in accordance with the principles of the present invention.

An electric field-controlled NEM system can be used in a variety of applications. FIG. 26 shows a schematic circuit diagram of NEM system 2600, which includes beam-based assembly 2605. Beam-based assembly 2605 may be constructed in accordance with the principles of the present invention, and illustrates one application that can make use of electric field-controlled nanometer-scale beams. Beam-based assembly 2605 may be modeled as voltage-controlled current source 2645 that conducts current from contact 2650 to contact 2640, and is controlled by the voltage across contact 2610 and 2620 provided by voltage source 2625. More particularly, current source 2945 may be constructed around nanometer-scale beams similar to beams 2320 and 2330 of FIGS. 23-25, and the current these nanometer-scale beams are able to draw may be affected by an electric field generated by voltage source 2625.

Figure 27:
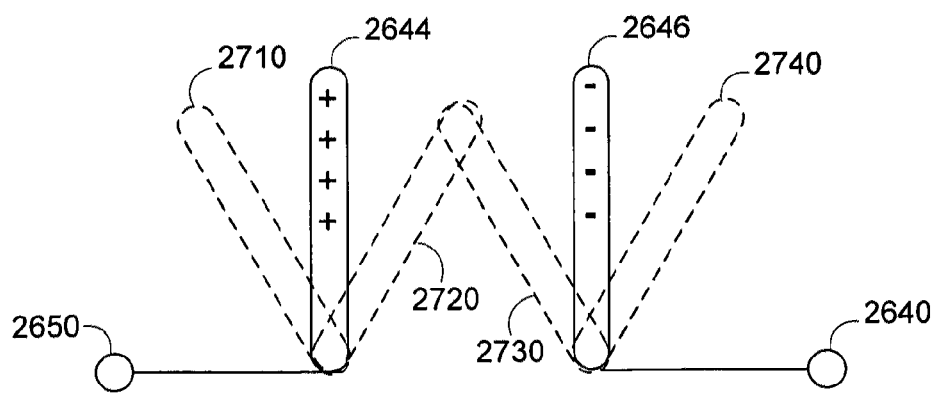
FIGS. 27-29 are schematics of a circuit element in FIG. 26 under different operating conditions.

FIG. 27 shows a more detailed view of one embodiment of current source 2645. Current source 2645 can include two nanometer-scale beams, beam 2644 and beam 2646, that may be similar to beams 2320 and 2330 of FIGS. 23-25. Beam 2644 may be connected to contact 2650 of nanometer-scale system 2605 and beam 2646 may be connected to contact 2640. Both of these beams may be operable to vibrate with respect to these contacts as a result of, for example, ambient temperature. For example, beam 2644 may vibrate substantially between position 2710 and 2720 and beam 2646 may vibrate substantially between position 2730 and 2740. Thus, beams 2644 and 2646 may contact each other as beams 2644 and 2646 vibrate, which may provide a path for current flow from contact 2650 to contact 2640. Thus, the average current provided across contacts 2650 and 2640 may depend on the rate or frequency of contact between beams 2644 and 2646.

Figure 28:
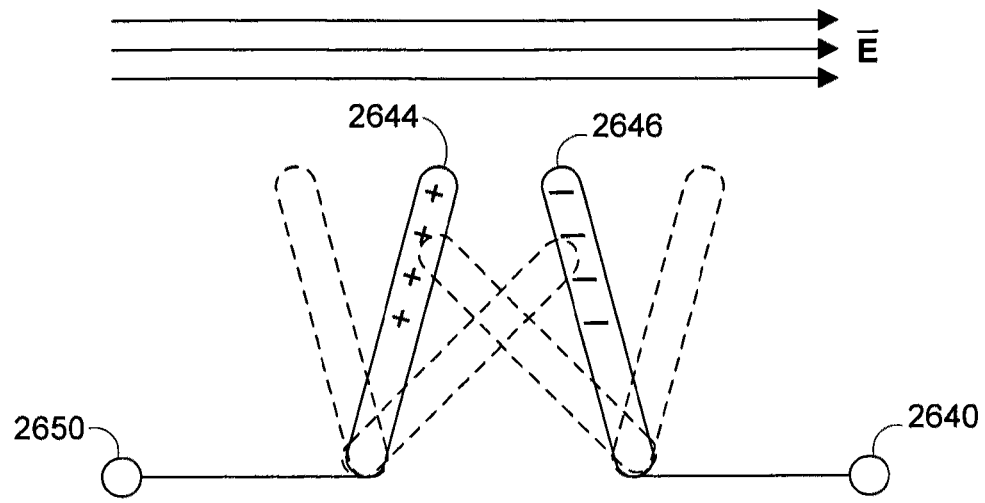

Voltage source 2625 may provide a voltage across contacts 2620 and 2610 that creates an electric field of a particular intensity and direction. The generated electric field may affect the contact rate of beams 2644 and 2646 by driving beams 2644 closer together or further apart when beams 2644 and 2644 are charged in the manner described above in connection with FIGS. 23-25. Beam 2644 may be provided with a positive charge from positive contact 2650 and beam 2646 may be provided with a negative charge from negative contact 2640. When voltage source 2625 generates a voltage that creates an electric field pointing from left to right, a force is exerted on beams 2644 and 2646 that drive them closer together. This scenario is similar to the operating scenario of FIG. 24 and is illustrated in FIG. 28. As shown in FIG. 28, the resting position of beam 2644 may be angled towards beam 2646, and the resting position of beam 2646 may be angled towards beam 2644. With a decreased distance that beams 2644 and 2646 need to travel in order to contact one another, beams 2644 and 2646 may contact one another at a greater contact rate when they vibrate. The current that may flow from contact 2650 to contact 2640 may therefore be greater than when no electric field is present.

Figure 29:
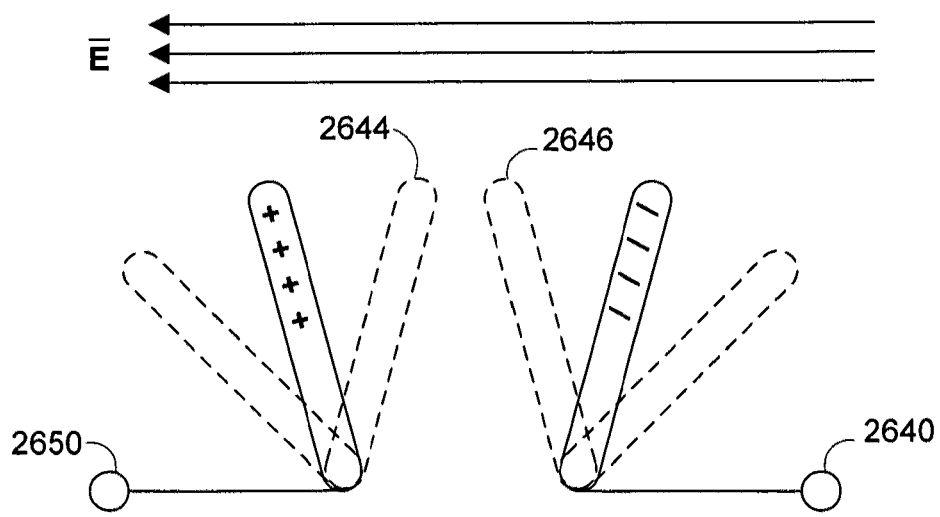

FIG. 29 illustrates the opposite scenario, where the voltage generated by voltage source 2625 creates an electric field that forces beams 2644 and 2646 away from one another. This operating scenario may be similar to that described above in connection with FIG. 25. In particular, the electric field on positively charged beam 2644 may exert a force that causes the resting position of beam 2644 to be angled away from beam 2644, and the electric field on negatively charged beam 2646 may exert a force that causes the resting position of beam 2646 to be angled away from beam 2644. Therefore, a greater distance would need to be traveled by beams 2644 and 2646 when they vibrate in order for these beams to contact one another. This greater distance may cause a decrease in the contact rate between beam 2644 and beam 2646, and therefore a decreased current flow between contact 2650 and contact 2640.

As demonstrated above and in FIGS. 28 and 29, the voltage provided by voltage source 2625 may create an electric field that affects the amount of current that beams 2644 and 2644, and therefore current source 2645, are able to conduct. Accordingly, current source 2645 may be viewed as being voltage-controlled. Persons skilled in the art will appreciate that additional pairs of nanometer-scale beams similar to beams 2644 and 2646 may be provided between contacts 2650 and 2640 as part current source 2946. These parallel pairs of beams may provide for a decreased effective resistance, and therefore an increased current. Also, these parallel pairs may allow current source 2645 to be more sensitive to changes in the voltage provided by voltage source 2625. That is, with an increased number of pairs of beams that are each affected by the electric field, the effect of the electric field may be magnified. The advantages of providing many pairs of nanometer-scale beams will become more apparent below in connection with FIGS. 30-33.

Persons skilled in the art will appreciate that beam-based assembly 2605 may model the operation of a metal oxide semiconductor field effect transistor (MOSFET). For example, contact 2650 may be the drain terminal of the MOSFET, contact 2640 may be the source terminal of the MOSFET, and contact 2620 may be the gate terminal of the MOSFET. Persons skilled in the art will also appreciate that beam-based assembly 2605 is not limited to the functionalities of a MOSFET, and may instead have characteristics of other types of transistors, such as those of a bipolar junction transistor (BJT) with collector, emitter, and base terminals.

Persons skilled in the art will also appreciate that beam-based assembly 2605 may be used for other applications than a transistor. For example, beam-based assembly 2605 may be configured for use as a generator, amplifier, memory cell, automatic switch, diode, variable resistor, magnetic field sensor, temperature sensor, electric field sensor or logic component. In particular, in some scenarios, voltage source 2625 may be an induced voltage source, such as a thermally-induced voltage source. In these scenarios, voltage source 2660 and resistor 2680 may be used as a current detector to indirectly determine the amount of induced voltage is present between contacts 2620 and 2610. The current detector may measure the amount of current flowing through resistor 2680 when a particular voltage is generated by voltage source 2660, and may use this detected current to compute the induced voltage. Thus, in these embodiments, contacts 2610 and 2620 may be input contacts, and NEM system 2600 may function as a sensor that senses the presence of a voltage across input contacts 2610 and 2620.

Figure 30:
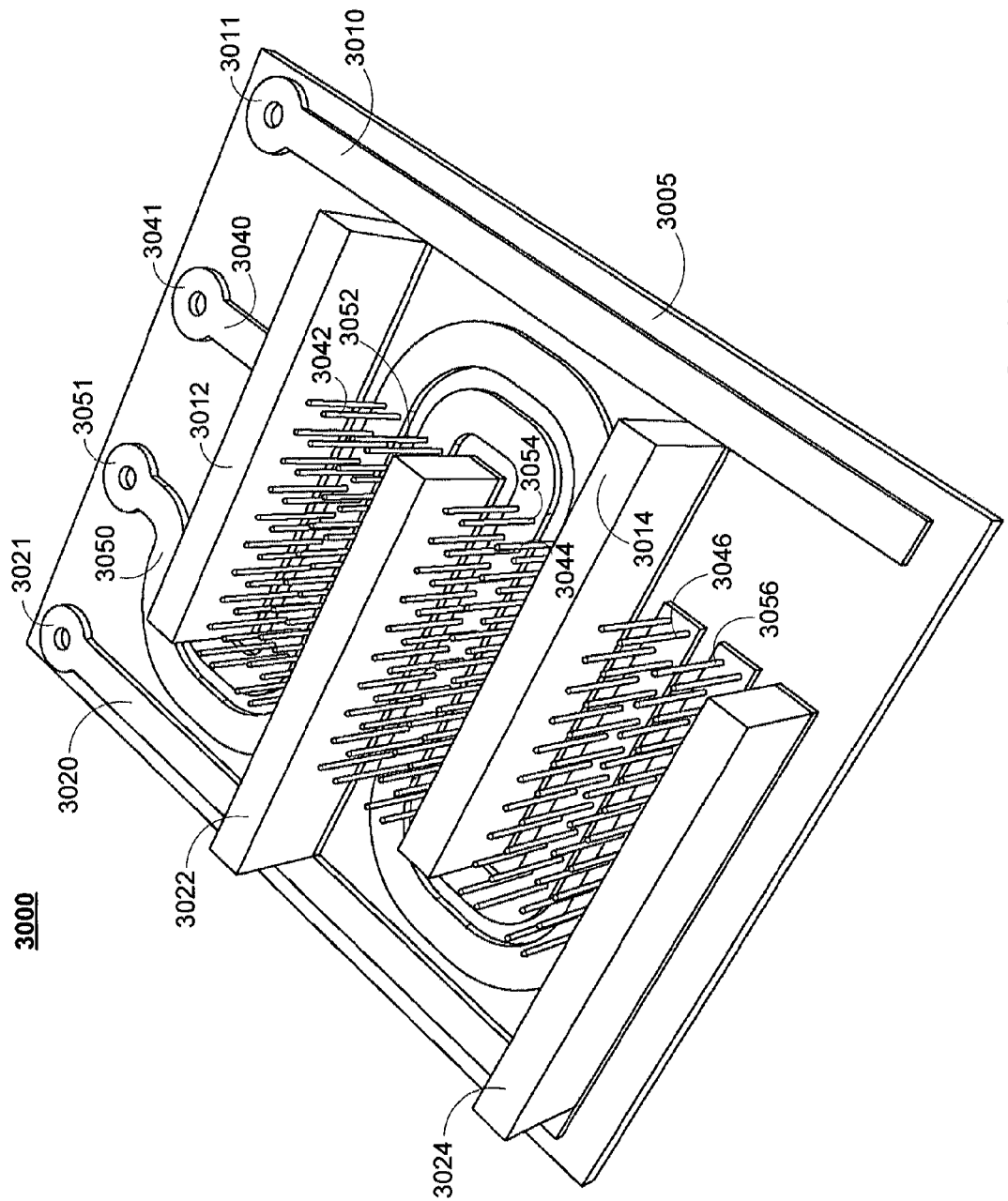
FIG. 30 is a three-dimensional perspective view of a nanoelectromechanical switching assembly constructed in accordance with the principles of the present invention.

Turning now to FIG. 30, a perspective view of nanoelectromechanical system 3000 is shown that includes a plurality of vertically grown or vertically placed beams. NEM system 3000 can include electrically conductive traces 3040 and 3050 fabricated on a semiconductor substrate 3005 on which a plurality of the vertically grown beams are grown. NEM system 3000 can also include trace 3020, which is electrically coupled to conductive walls 3022 and 3024, and trace 3010, which is electrically coupled to conductive walls 3012 and 3014. NEM system 3000 can be similar to nanometer-scale assembly 2605 of FIG. 26 in that NEM system 3000 may model the operation and/or components of nanometer-scale assembly 2605, and NEM system 3000 may operate as a transistor or switching assembly. For example, traces 3010, 3020, 3020, and 3040 may have similar functionalities to contacts 2610, 2620, 2640, and 2650 of FIG. 26, respectively, and the beams in FIG. 30 may be similar to beams 2644 and 2646 in FIG. 27. More particularly, the beams grown or placed on trace 3040 may have similar functionality as beam 2646 of FIG. 27 and the beams grown or placed on trace 3050 may have similar functionality as beams 2644 of FIG. 27.

A first plurality of nanometer-scale beams, including beams 3042, 3044, and 3046, may be grown or placed on trace 3040 such that these beams extend approximately perpendicularly from semiconductor substrate 3005 (e.g., in a vertical direction). These beams may be any of a variety of nanometer-scale beams, such as nanowires, nanotubes, or piezoelectric elements. The first plurality of beams may be electrically conductive. Therefore, the base of each of these beams may be electrically coupled to one another and may be provided with a charge that is provided to trace 3040.

Similarly, a second plurality of nanometer-scale beams, including beams 3052, 3054, and 3056, may be grown or placed on trace 3050. Each of these beams may extend perpendicularly from semiconductor substrate 3005 (e.g., in a vertical direction). The second plurality of beams on trace 3050 may be the same or a different type of nanometer-scale beam as the first plurality of beams on trace 3040, and may be fabricated to be parallel the first plurality of beams. The beams on trace 3050 may be electrically conductive, and each of these beams may be provided with a charge that is provided to trace 3050.

The nanometer-scale beams fabricated on traces 3040 and 3050 may vibrate as a result of, for example, ambient temperature or light. As the beams vibrate, one or more beams on trace 3040 may come into contact with one or more beams on trace 3050. For example, beam 3042 on trace 3040 may sometimes bend towards beam 3052 on trace 3052 as beam 3042 vibrates, and beam 3052 may sometimes bend towards beam 3042 as beam 3052 vibrates. Thus, beams 3042 and 3052 may come into physical contact with one another at a contact rate, and an electrical connection may be formed between trace 3040 and trace 3050 through these beams whenever these beams are electrically coupled. During these times, current can flow between traces 3040 and 3050 through the connected beams.

Persons skilled in the art will appreciate that many beams (e.g., billions or trillions of beams) may be fabricated on both traces 3040 and 3050. Each of these many beams may contact another beam at a contact rate. With so many beams being able to provide an electrical connection between traces 3040 and 3050, the percentage of the time that an electrical connection is formed between these traces through at least one pair of beams may be large. Moreover, the number of beams that are in contact may be large for larger numbers of beams, allowing for a lower effective resistance. For example, if each beam has a resistance of 1000 ohms, 10 billion beams are fabricated on each trace, and ten percent of the beams on a trace are in contact with the beams on the other trace, the effective resistance would be approximately 1 micro-ohm. Thus, by providing upwards from billions or trillions of nanometer-scale beams, a suitably large current may be conducted between traces 3040 and 3050.

Figure 31:
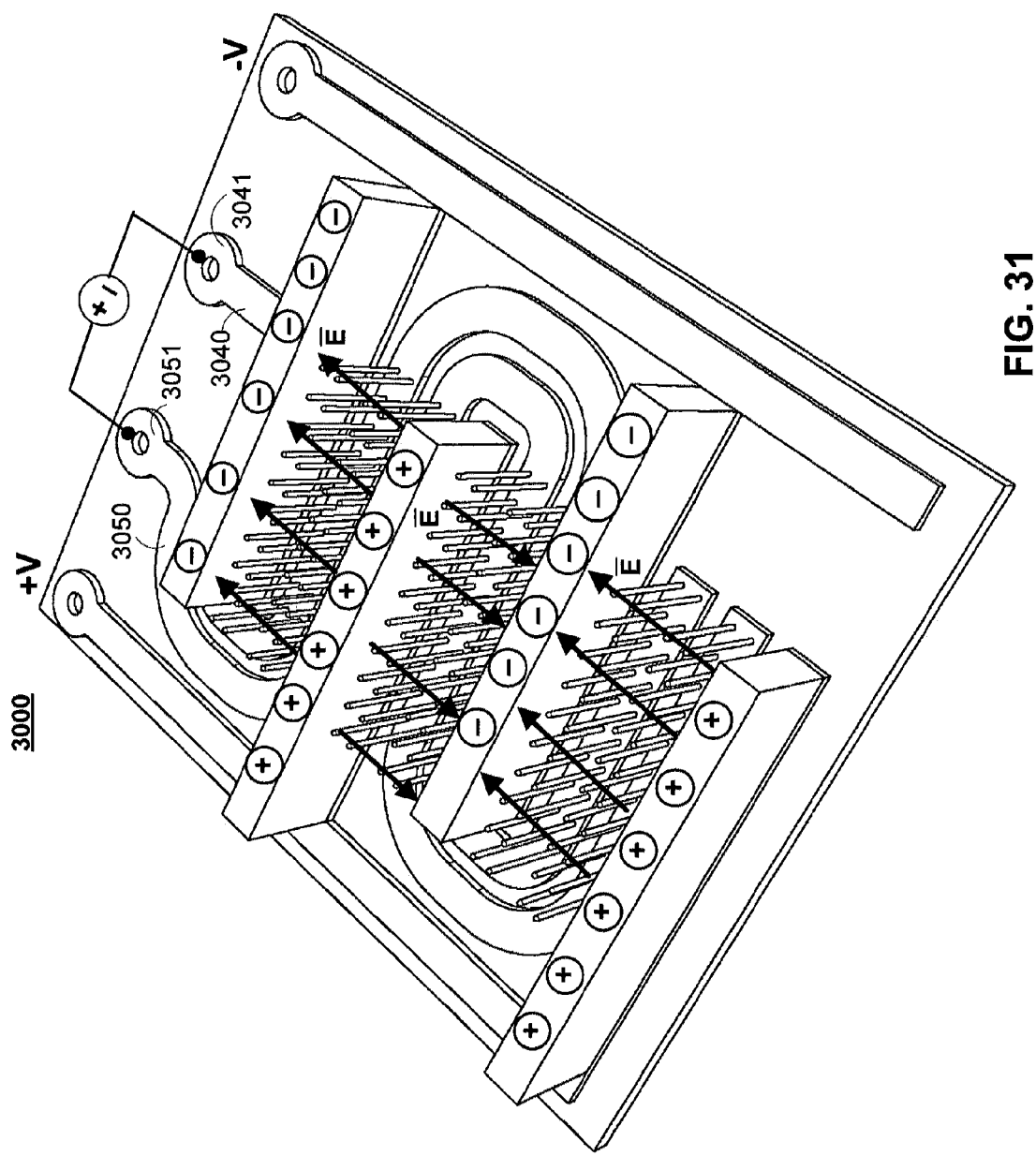
FIGS. 31 and 32 are three-dimensional perspective views of the nanoelectromechanical switching assembly of FIG. 30 under different operating conditions.
Figure 32:
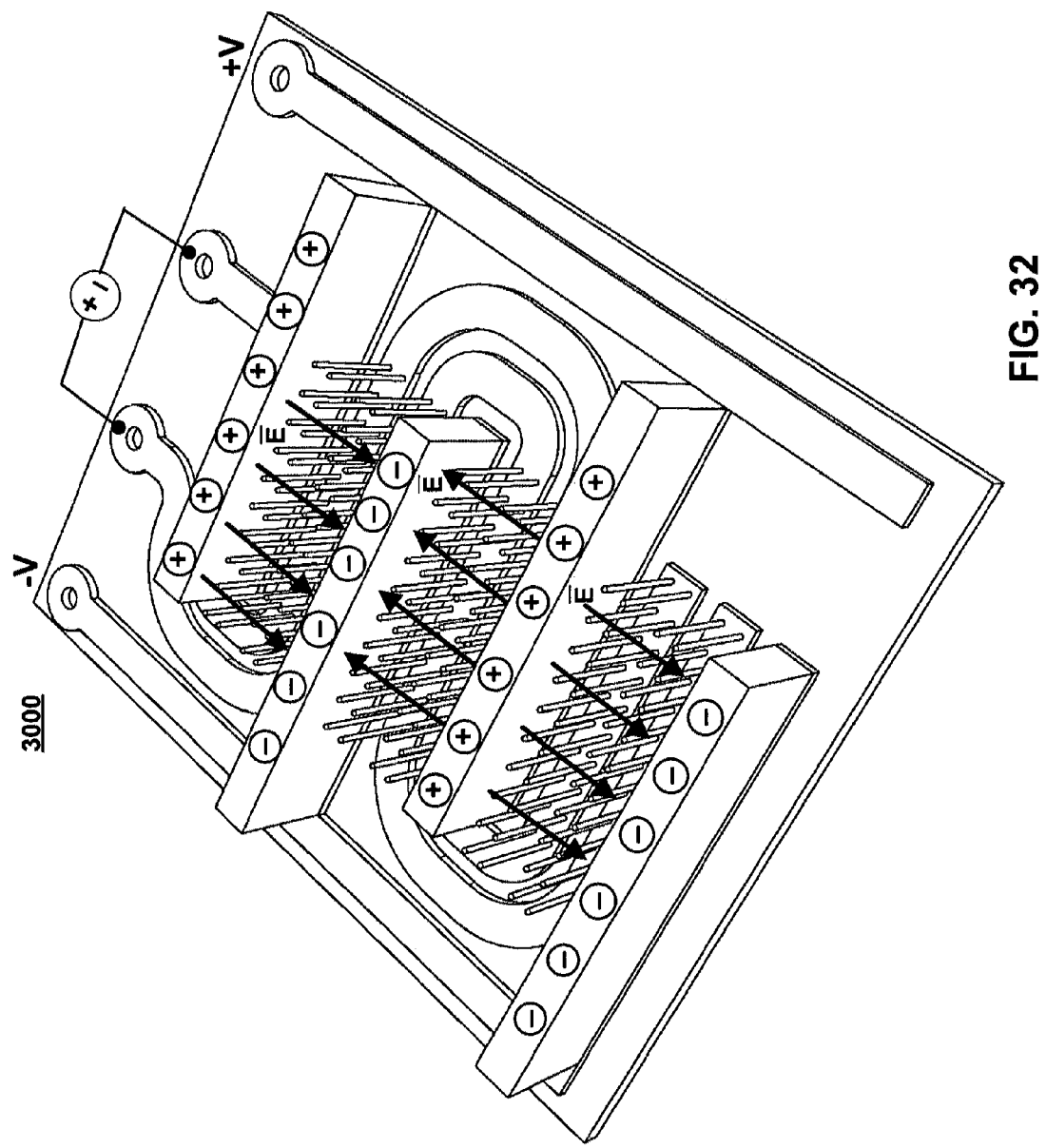

NEM system 3000 may be constructed such that traces 3040 and 3050 bend around a plurality of conductive walls, including conductive walls 3012, 3022, 3014, and 3024. Each conductive wall may either be connected to trace 3020 or to trace 3010, and the conductive walls are arranged so that neighboring conductive walls are connected to different traces. This way, when a voltage is provided across trace 3010 and 3020, an electric field may be generated between each pair of neighboring walls. For example, FIG. 31 shows the resulting electric fields that are created between each pair of conductive walls when a positive charge is provided to trace 3020 and a negative charge is provided to trace 3010. FIG. 32 shows the resulting electric fields in the opposite scenario—that is, when a negative charge is provided to trace 3020 and a positive charge is provided to trace 3010.

The beams in NEM system 3000 may be grown or placed on traces 3040 and 3050 such that the beams are between a pair of conductive walls. Thus, when charges of opposite polarity are provided to traces 3040 and 3050, the beams on these respective traces may be electrically influenced by the electric field generated between the pair of conductive walls. For example, in some operating scenarios, such as that described above in connection with FIG. 6, a positive charge may be provided to trace 3050 and a negative charge may be provided on trace 3040. Accordingly, the beams on trace 3050 may be positively charged, and the beams on trace 3040 may be negatively charged. When an electric field is provided between the conductive walls of NEM system 3000, the electric field may interact with the positive charges of the beams of trace 3050 and the negative charges on the beams of trace 3040.

The polarity of the charges provided to contacts 3010 and 3020 may be controlled to affect whether the beams on traces 3040 and 3050 are pulled apart or pushed together, and therefore whether the contact rate and current flow is decreased or increased. For example, turning again to FIG. 31, NEM system 3000 is shown in which a situation similar to that shown in FIGS. 24 and 28 is present. In particular, between each pair of conductive walls, an electric field exists that is pointing in a direction that forces pairs of beams towards each other. Therefore, as in the illustration of FIG. 28, beams on trace 3050 and beams on trace 3040 may be attracted to one another, and may contact each other at a higher contact rate or frequency than when no electric field is present.

Turning again to FIG. 32, NEM system 3000 is shown in which a situation similar to that shown in FIGS. 25 and 29 is present. In particular, between each pair of conductive walls, an electric field exists that is pointing in a direction that forces pairs of beams away from each other. Therefore, as illustrated in FIG. 29, beams on trace 3050 and beams on trace 3040 may be angled away from each other, resulting in a lower contact rate or frequency than when no electric field is present.

Persons skilled in the art will appreciate that NEM system 3000 can be used in any of a variety of applications, including those described above in connection with FIG. 26. For example, NEM system 3000 may be used as a switching assembly. The switch may be in an OPEN state when the voltage provided across contacts 3010 and 3020 is of a sufficient polarity and strength to pull the beams on trace 3040 from the beams on trace 3050, and vice versa, to the point where few or no connections between these respective beams are formed. The switch may be in a CLOSED state when the voltage provided across contacts 3010 and 3020 is of the opposite polarity and of a sufficient strength to cause the beams on trace 3040 and the beams on trace 3050 to form a substantially constant electrical connection between traces 3040 and 3050.

Persons skilled in the art will also appreciate that NEM system 3000 may operate as an effective sensor for sensing voltages across traces 3010 and 3020. In particular, contacts 3011 and 3021 may be input contacts to NEM system 3000, and these contacts may be connected to a device or other input that voltage sensing is desired. The voltage applied to contacts 3011 and 3021 may be provided along traces 3010 and 3020, respectively, resulting in electric fields between the conductive walls of NEM system 3000. The voltage level provided to input contacts 3011 and 3021 may directly determine the intensity of the electric field and consequently the amount of current that can be drawn through traces 3040 and 3050. Because NEM system 3000 can include billions or trillions of beams and the electric field may affect the individual contact rate of all of these billions or trillions of beams, the amount of current that can be drawn through these beams may be highly sensitive to the electric field. Thus, a sense circuit (not shown) may be coupled to traces 3040 and 3050 to detect the amount of current flow between these traces, which gives an accurate indication as to the voltage level across contacts 3011 and 3021. The sense circuit may include a voltage source and resistor coupled in series to traces 3040 and 3040, such as those shown in FIG. 26, where the current flow can be detected by measuring the current through the resistor.

Figure 33:
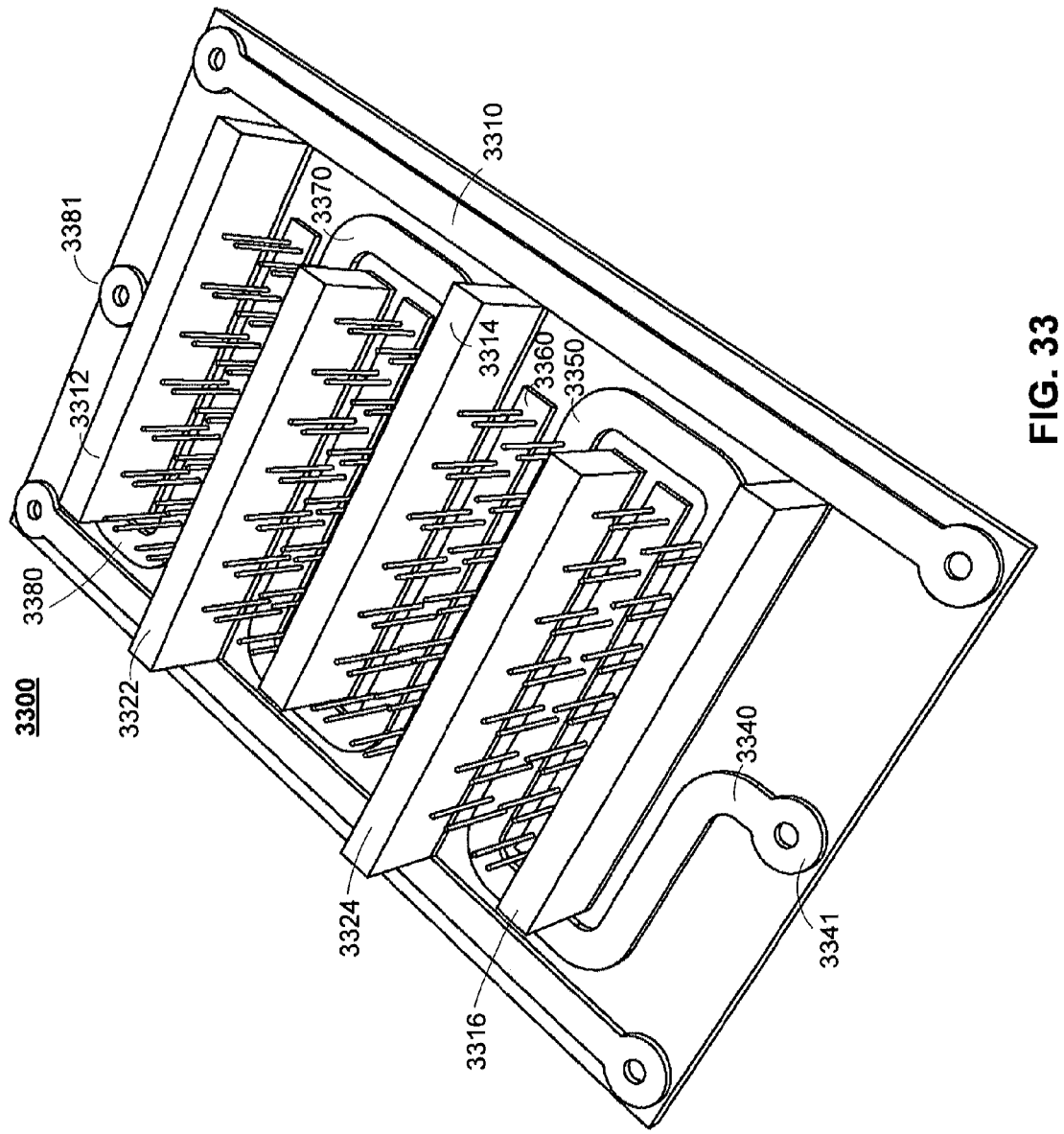
FIG. 33 is a three-dimensional perspective view of a nanoelectromechanical switching assembly constructed in accordance with the principles of the present invention.

Referring now to FIG. 33, a perspective view of nanoelectromechanical system 3300 is shown. NEM system 3300 may be a serpentine converter that operates using nanometer-scale beams, such as carbon nanotubes. NEM system 3300 can have components with any of the features and functionalities described above in connection with NEM system 3000 of FIGS. 30-32. For example, NEM system 3300 can also be constructed around vertical beams that are grown or placed on side-by-side traces, where the side-by-side traces are aligned between parallel conductive walls (e.g., between conductive walls 3312 and 3322). The vertical beams on separate traces may vibrate such that the free-moving portions of the beams are able to contact one another. Also similar to NEM system 3000 of FIGS. 30-32, the conductive walls in NEM system 3300 may be coupled to traces 3310 and 3320 in an alternating fashion such that an electric field may be generated between each pair of neighboring conductive walls when opposite charges are provided to traces 3310 and 3320.

Unlike in NEM system 3000 of FIGS. 30-32, where traces 3040 and 3050 bend around each pair of conductive walls, each trace in NEM system 3300 lies between at most two conductive walls. For example, trace 3350 lies between conductive walls 3316 and 3324 and conductive walls 3324 and 3314 only. A nanoelectromechanical system configured in this manner may be used as a generator. In particular, the beams fabricated on traces 3340 and 3350 may vibrate and provide an electric potential as a result of thermal noise. When the beams on these respective traces touch, the electric potential generated by the beams on trace 3340 and the electric potential generated by the beams on trace 3350 may be accumulated and provided as a voltage across traces 3340 and 3350.

Trace 3350 may have two groups of vertically grown or vertically placed nanometer-scale beams. The first group may be placed between conductive walls 3316 and 3324, and this first group may able to receive and add to the electric potential generated by the beams on trace 3340. The second group of beams on trace 3350 may be located between conductive wall 3324 and conductive wall 3314. These beams may vibrate and provide an electric potential to trace 3360 when the free-moving portions of the beams in the second group contact the free-moving portions of the neighboring beams on trace 3360. Thus, an additional voltage may be applied across traces 3350 and trace 3360, thereby providing a greater potential difference between traces 3360 and 3340 than traces 3350 and 3340. The other traces in NEM system 3300 (e.g., traces 3360 and 3370) may operate in a similar manner to trace 3350. Thus, the different traces in NEM system 3300 (e.g., traces 3340, 3350, 3360, 3370, and 3380) are connected in series, where the electric potential is stepped up (or down) from one trace to the next. Contacts 3341 and 3381, which are coupled to traces 3340 and 3381, respectively, may be output contacts that are provided with a voltage that is the sum of all the voltages generated across traces 3340, 3350, 3360, 3370, and 3380.

Persons skilled in the art will appreciate that either output contact 3341 or output contact 3381 may act as the negative terminal of NEM system 3300. The polarity of contacts 3341 and 3381 may be controlled by the polarity of the charges provided to traces 3310 and 3320. In particular, the charges provided to traces 3310 and 3320 affect the direction of the electric field between each pair of conductive walls. Due to Johnson noise, the nanometer-scale beams in NEM system 3300 may have a time-varying charge on their surface. The time-varying charge may interact with the electric field between each pair of conductive walls, causing the beams on separate traces to, at any given point in time, bend towards each other, away from each other, or in the same direction depending on the direction of the electric field. As described and illustrated below in connection with FIGS. 34 and 35, this interaction may be utilized to produce a voltage of a particular polarity across the side-by-side traces.

Figure 34:
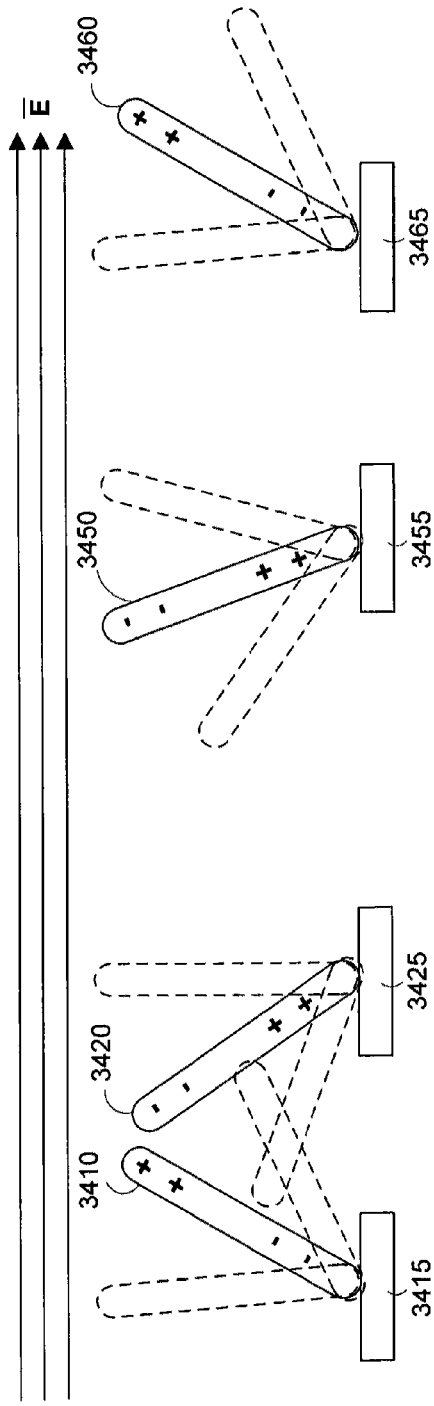
FIGS. 34 and 35 are schematic diagrams that illustrate the operation of the nanometer-scale serpentine converter of FIG. 33 under different operating conditions.

FIG. 34 shows a schematic diagram of nanometer-scale beams 3410 and 3415, which may be vertically grown or placed on traces 3425 and 3415, respectively, and nanometer-scale beams 3450 and 3460, which may be vertically grown or placed on traces 3455 and 3465, respectively. Beams 3410 and 3420, as well as beams 3450 and 3460, may both represent any two beams in NEM system 3300 of FIG. 30 that are on separate side-by-side traces. For example, beam 3410 may represent nanometer-scale beam 3352 on trace 3352 and beam 3415 may represent nanometer-scale beam 3342 on trace 3340. Trace 3415 and trace 3455 may represent the same trace or different traces. Similarly, trace 3425 and trace 3465 may represent the same trace or different traces. At any point in time, a charge distribution may be present on beams 3410, 3420, 3450, and 3460 as a result of thermal noise. For example, as illustrated in FIG. 34, beams 3410 and 3460 may have positive charges at their tips and beams 3420 may have negative charges at their tips. When an electric field is provided in the direction illustrated in FIG. 34 (left to right), the electric field may interact with beams 3410 and 3420 to push these beams together. Thus, as beams 3410 and 3420 vibrate and contact one another, the electric potentials produced by beams 3410 and 3420 may be summed and provided as a voltage across traces 3415 and 3425.

The electric field may also interact with the charges on beam 3450 and 3460 in a manner that pushes beams 3450 and 3460 apart from one another. While such charge distributions are present on beams 3450 and 3460, beams 3450 and 3460 may rarely or never contact one another. Therefore, when the electric field points in a direction from left to right, the vast majority of contact events may occur between beams on a left trace (e.g., traces 3415 and 3455) with instantaneous positive charges on their tips and beams on a corresponding right trace (e.g., traces 3425 and 3465) with instantaneous negative charges at their tips. This may result overall in a higher electric potential being provided to the right trace.

Figure 35:
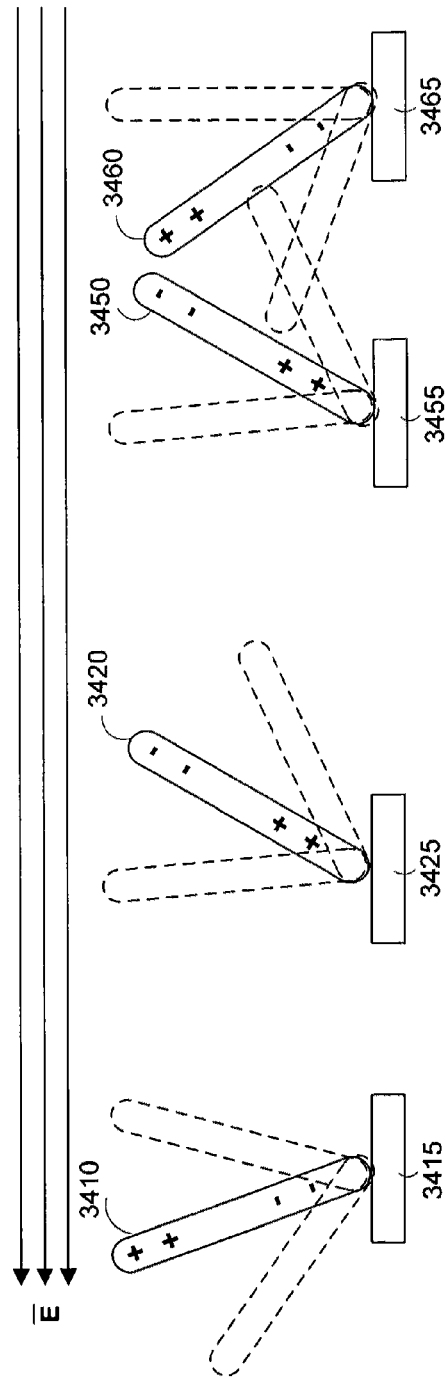

Referring now to FIG. 35, the effect of providing an electric field in the opposite direction than that shown in FIG. 34 is illustrated. FIG. 35 again shows beams 3410, 3420, 3450, and 3460 having the same charge distributions as shown in FIG. 34. Because of the opposite direction of the electric field, beams 3410 and 3420 are now forced apart while beams 3450 and 3460 are brought closer together. Therefore, with an electric field pointing from right to left, the vast majority of contact events may occur between beams on a left trace (e.g., traces 3415 and 3455) with instantaneous negative charges on their tips and beams on a corresponding right trace (e.g., traces 3425 and 3465) with instantaneous positive charges at their tips. Unlike in FIG. 34, this may result overall in a higher electric potential being provided to the left trace. Returning to FIG. 33, the ability to provide the higher potential to either a left or right trace, as demonstrated in FIGS. 34 and 35, allows either contact 3341 or contact 3381 to be used as the positive terminal of NEM system 3300.

In some embodiments, some of the nanometer-scale beams in NEM system 3300 of FIG. 33 may be piezoelectric beams, such as zinc-oxide nanowires. More particularly, between each pair of conductive walls, the beams on one trace may be made of piezoelectric material. The beams on the other trace may each be any suitable type of electrically conductive beam, such as a carbon nanotube or a nanowire coated with an electrically conductive film. With this configuration, the voltage generated across the piezoelectric beams due to thermal noise may be enhanced by the voltage produced from the mechanical stress on the beams. For example, referring again to FIG. 34, beam 3420 may be a zinc-oxide nanowire that produces a voltage across beam 3420 with the same polarity as the thermally-induced voltage, thereby creating a voltage with a greater magnitude than if beam 3420 did not have piezoelectric properties. The overall voltage provided across trace 3415 and 3425 would therefore be greater as well. In this example, beam 3410 would not generate a voltage due to mechanical stresses, which is desirable because the generated voltage would have opposed and substantially cancelled out the voltage generated by beam 3420.

Figure 36:
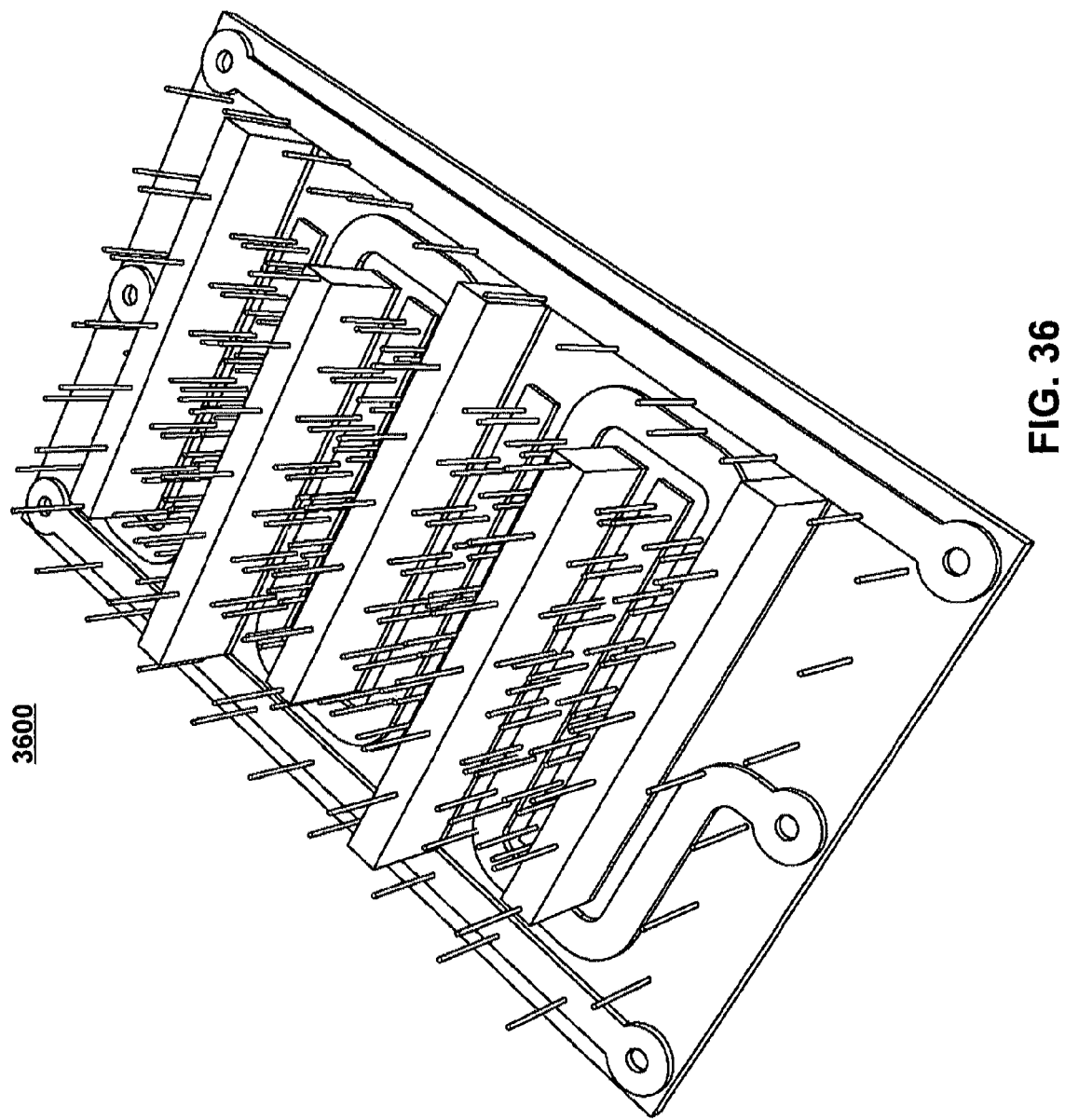
FIG. 36 is a three-dimensional perspective view of a nanometer-scale serpentine converter similar to the converter of FIG. 33.

Turning to FIG. 36, nanoelectromechanical system 3600 is shown that is constructed in accordance with the principles of the present invention. NEM system 3600 may be similar to NEM system 3300 of FIG. 33, except that NEM system 3600 may have additional nanometer-scale beams placed at locations other than on traces between pairs of conductive walls. For example, additional beams may be placed on top of the conductive walls or on the semiconductor substrate. These additional beams may result when seeds intended for the traces between conductive walls fall at other locations. None of these errant beams, however, impact the performance or stability of NEM system 3600. Therefore, NEM system 3300 of FIG. 33 and NEM system 3600 of FIG. 36 may be constructed in a manner that is resilient to manufacturing variations and defects.

Figure 37:
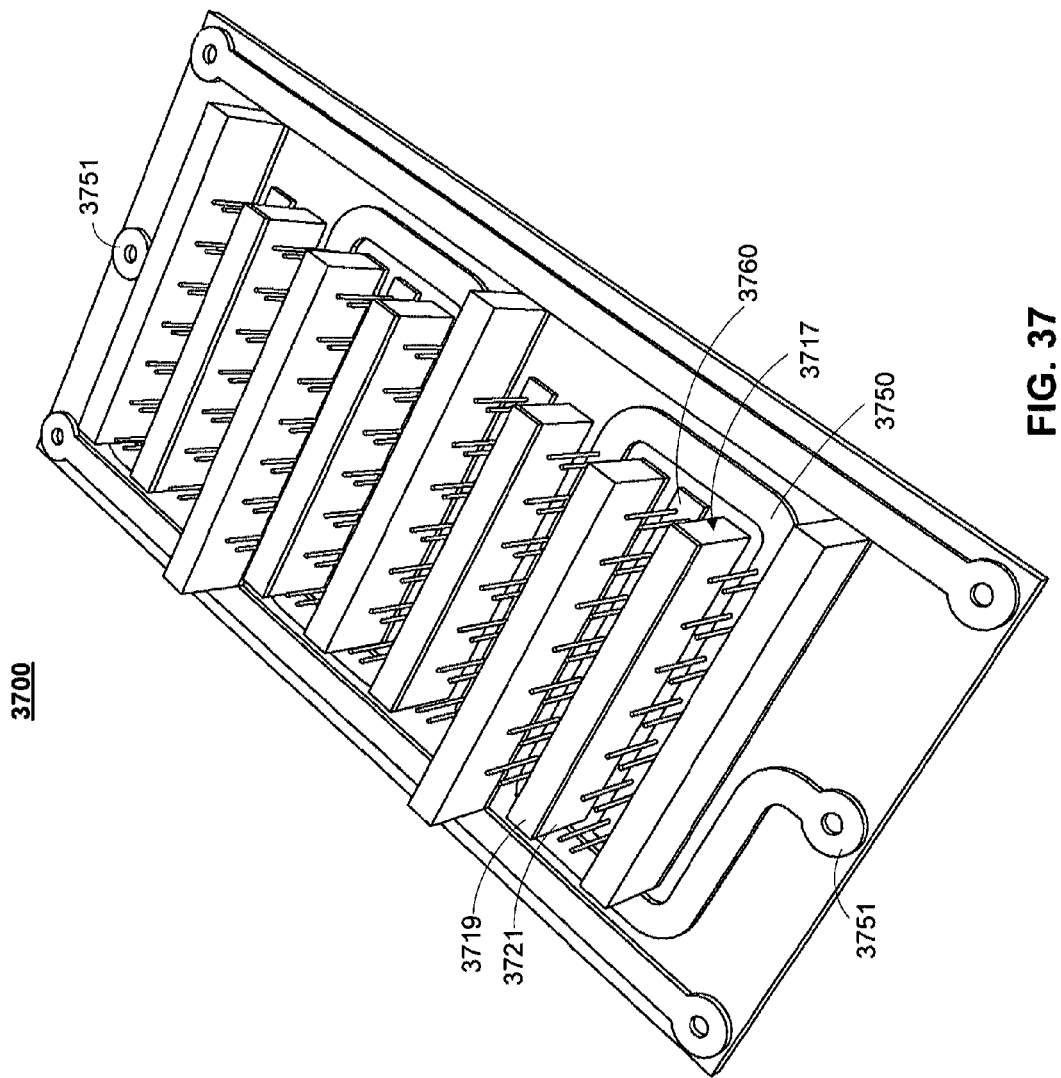
FIG. 37 is a three-dimensional perspective view of a nanometer-scale serpentine converter constructed in accordance with the principles of the present invention.

FIG. 37 is a perspective view of nanoelectromechanical system 3700 constructed in accordance with the principles of the present invention. NEM system 3700 may be similar in features and functionalities to NEM system 3300 of FIG. 33. However, rather than providing side-by-side traces between each pair of conductive walls, NEM system 3700 may include an interfacing wall between the traces. For example, interfacing wall 3717 may be provided between trace 3750 and trace 3750. Interfacing wall 3717 may include conductive layer 3719, as well as layer 3721 which may or may not be conductive. The nanometer-scale beams on trace 3760 and the associated nanometer-scale beams on trace 3650 may be electrically coupled to one another when at least one beam on each trace contacts conductive layer 3719. This configuration therefore has the advantageous feature of providing an electrical connection between trace 2560 and trace 3750 when any pair of nanometer-scale beams on opposite sides of interfacing wall 3717 contact conductive layer 3719, and not just two side-by-side pairs. In this way, the effective contact rate of the beams and the power generation capabilities of NEM system 3700 can be increased.

Persons skilled in the art will appreciate that the interfacing walls in NEM system 3700 of FIG. 37 may be positioned closer to one trace than to the other. For example, interfacing wall 3717 may be placed closer to trace 3760 than to trace 3750, or vice versa. When the relative position of interfacing wall 3717 is offset, the amount that a beam needs to bend in order to contact conductive layer 3719 may be based on whether that beam is on trace 3760 or trace 3750, which may affect the magnitude of the electric potential generated by the beams. For example, in embodiments where the beams on trace 3750 are made of piezoelectric material (e.g., nanowires), the beams on trace 3750 may produce a greater electric potential when interfacing wall 3717 is positioned further from trace 3750. Therefore, the placement of the interfacing walls may be selected to provide maximal power generation between contacts 3741 and 3751.

Persons skilled in the art will appreciate that beams in NEM system 3700 may not need to be provided on both traces 3750 and 3760. For example, rather than providing a plurality of beams on trace 3760, conductive layer 3719 may be directly connected to trace 3760 using any suitable conductive material. In these embodiments, the voltage provided across trace 3750 and trace 3760 may be derived entirely from the electric potential generated by the beams on trace 3750.

Persons skilled in the art will also appreciate that interfacing walls, such as those shown in FIG. 37, may be used in other nanoelectromechanical systems with vertical beams. For example, interfacing walls may be added to NEM system 3300 of FIG. 33.

FIGS. 38-42 illustrate exemplary perspective cross-sectional views of the nanoelectromechanical system of FIG. 33 in various stages of fabrication.

Figure 38:
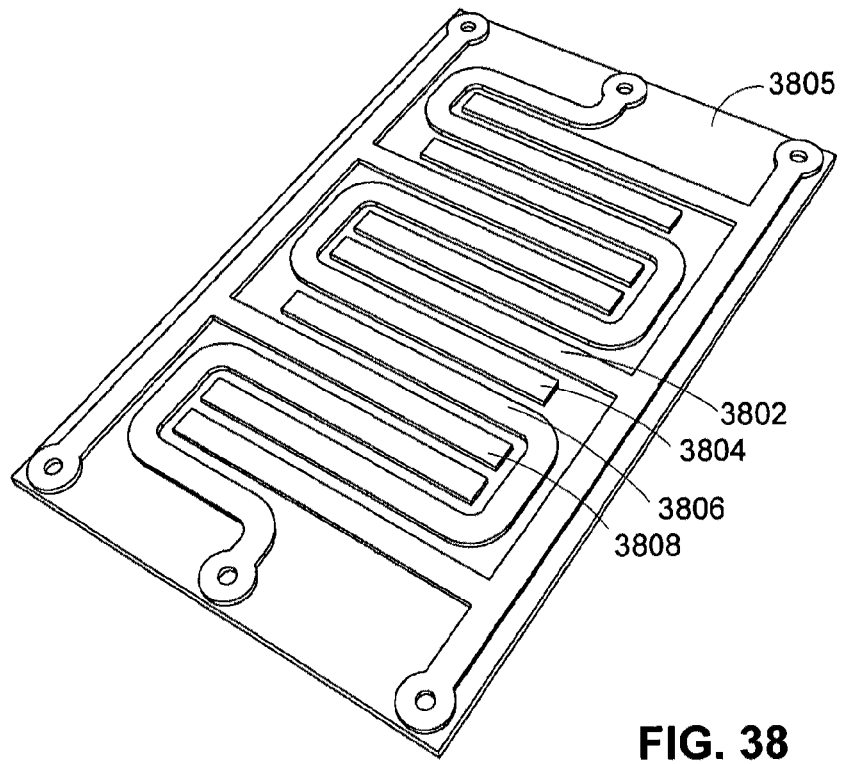
FIGS. 38-42 illustrate exemplary perspective cross-sectional views of the nanoelectromechanical system of FIG. 33 in various stages of fabrication.
Figure 39:
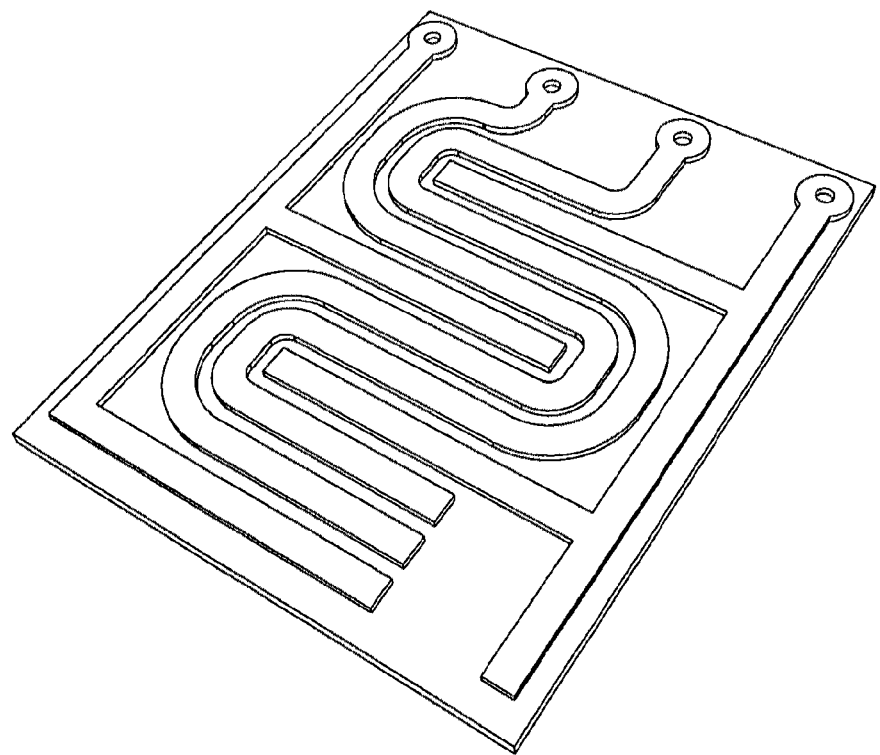

Turning first to FIG. 38, package 3800 is shown including a plurality of traces that are placed on substrate 3805. Substrate 3805 may be a semiconductor substrate, and the plurality of traces may be placed using any conventional semiconductor processing technique. The traces can include, for example, traces 3802, 3804, 3806, and 3808, which may be made of any suitable conductive material, such as a type of metal (e.g., aluminum, copper, tin, or tungsten). These traces may be fabricated to have any shape necessary depending on the desired operation of the nanoelectromechanical system. For example, at least a segment of traces 3802, 3804, 3806, and 3808 may be parallel to one another. At other segments, traces 3802 and 3808 may extend to the edges and/or corners of substrate 3805 and can terminate with an input or output contact, or traces 3802 and 3808 may be coupled to an input/output (I/O) trace. In some embodiments, traces 3804 and 3806 may be shaped to bend around traces 3802 and 3804 and/or each other. FIG. 38 illustrates one way that traces can be placed on substrate 3805, and FIG. 39 shows another. In particular, FIG. 38 is the configuration that may be used to produce NEM system 3300 of FIG. 30 and FIG. 39 is the configuration that may be used to produce NEM system 3000 of FIG. 30.

Figure 40:
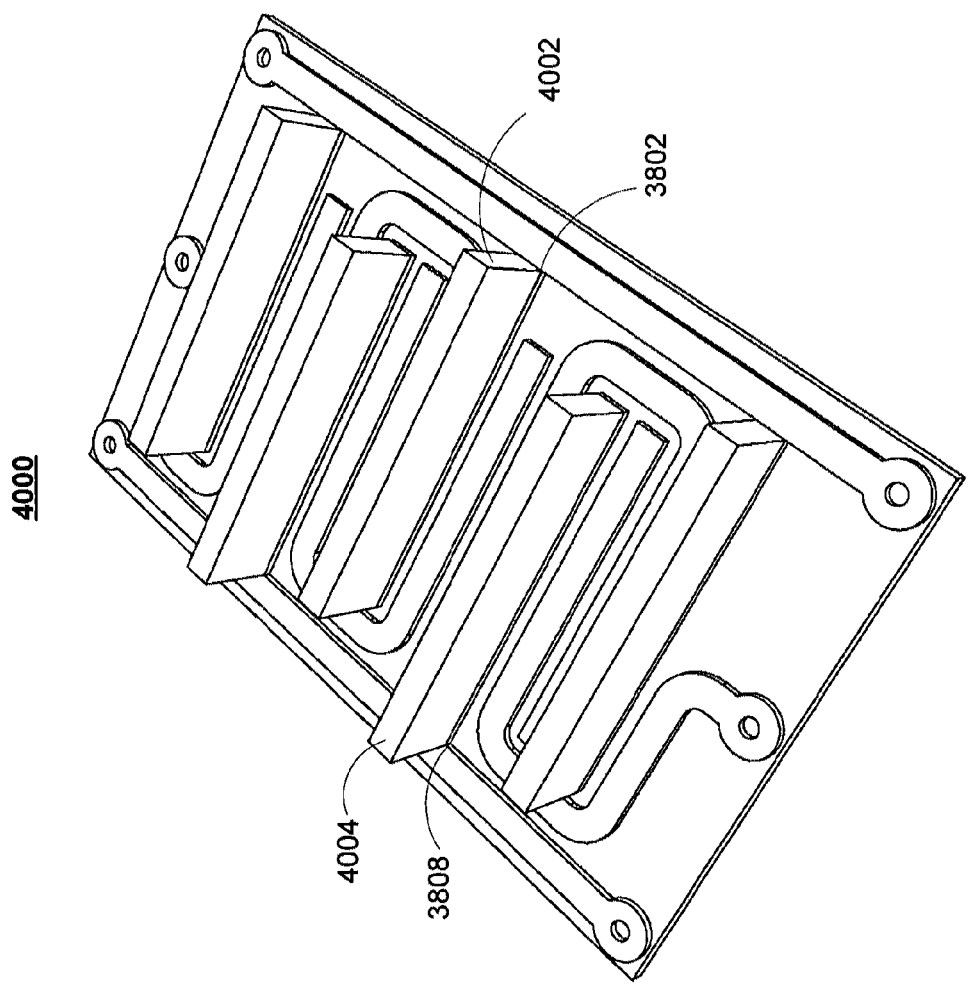

Package 4000, which is shown in FIG. 40, illustrates conductive walls may be deposited on some of the traces. The conductive walls may be made of the same or a different material than the traces. For example, conductive wall 4002 may be placed on trace 3802, and conductive wall 4004 may be placed on trace 3808. Conductive walls 4002 and 4004 may be fabricated and placed using any suitable technique, such as by selective disposition, sputter deposition, plasma vapor deposition, or a chemical vapor deposition (CVD), for example.

Figure 41:
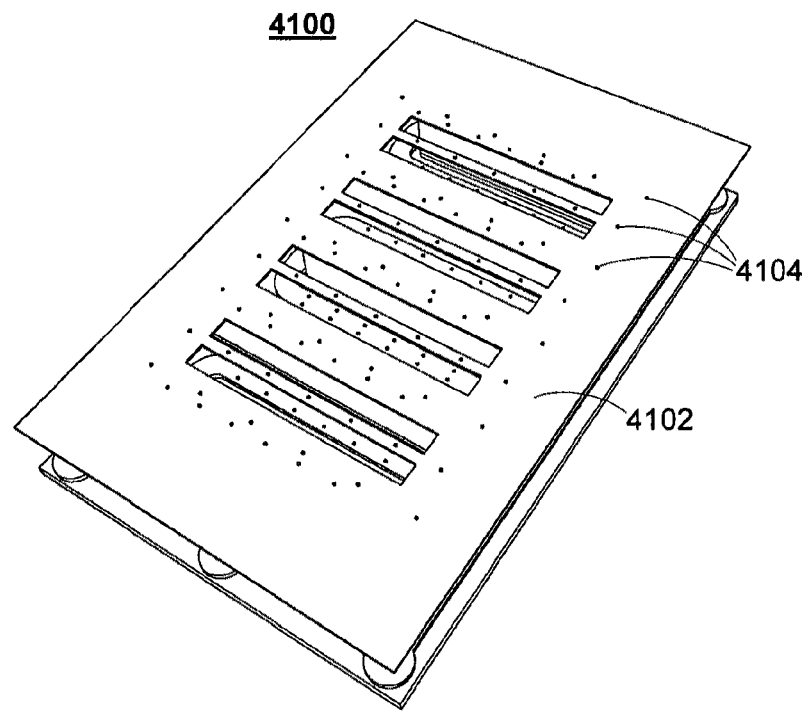

Referring now to FIG. 41, package 4100 is shown, which illustrates grate 4102 that is provided over the NEM system constructed thus far. Grate 4102 may have apertures that correspond to the locations where nanometer-scale beams are desired. For example, grate 4102 may have apertures positioned over the portions of trace 3804 and trace 3806 that are located between conductive walls 4002 and 4004. Metallic seeds 4104 may then be dropped onto grate 4102 such that at least a portion of metallic seeds 4104 fall through the apertures. Grate 4102 may prevent metallic seeds 4104 from dropping at locations where nanowires are not desired.

Figure 42:
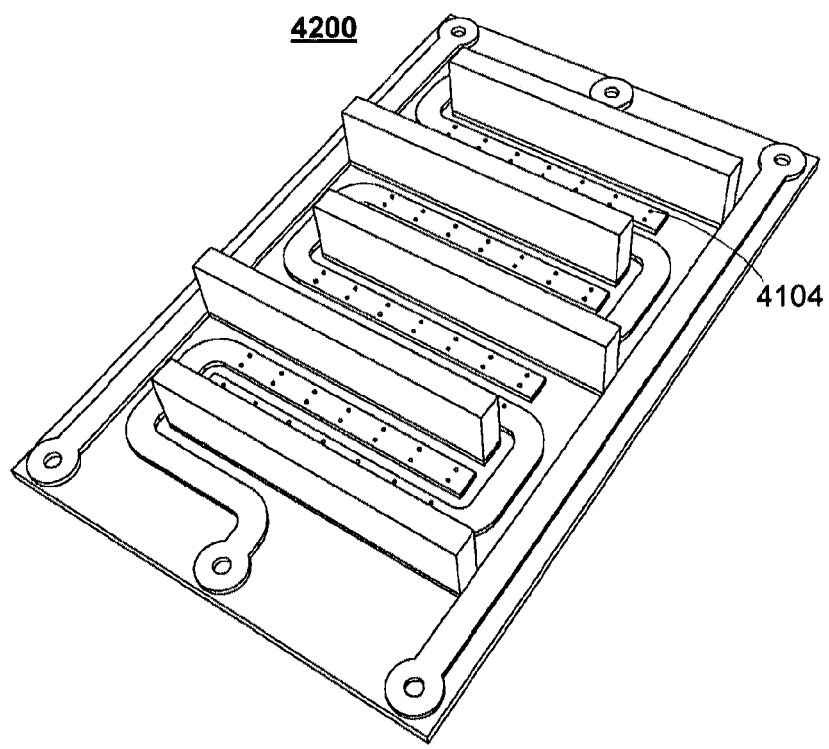

FIG. 42 shows the NEM system once grate 4102 is removed. The NEM system may include metallic seeds 4104 at desired locations. Nanometer-scale beams may be grown from metallic seeds 4104 to an appropriate height. The beams may be, for example, carbon nanotubes, nanowires, or piezoelectric elements. Once the beams are grown, the nanoelectromechanical system may resemble NEM system 3300 of FIG. 33.

Persons skilled in the art will appreciate that the fabrication techniques applied to construct NEM system 300 of FIG. 30 may be applied to other nanoelectromechanical systems, such as NEM system 3000 of FIG. 30. Persons skilled in the art will also appreciate that some of the packages shown in FIGS. 38-42 may be altered or fabricated using other than the described techniques without departing from the present invention. For example, rather than dropping metallic seeds through apertures of a grate, nanometer-scale beams may be grown on a growing surface and placed onto the nanoelectromechanical system.

The foregoing describes nanoelectromechanical systems and methods for making the same. Other nanoelectromechanical systems based on nanometer-scale beams and having advantageous features are disclosed in U.S. patent application Ser. No. 09/885,367, filed on Jun. 20, 2001 that issued as U.S. Pat. No. 6,593,666 on Jul. 15, 2003, U.S. patent application Ser. No. 10/453,326 filed on Jun. 2, 2003 that issued as U.S. Pat. No. 7,199,498 on Apr. 3, 2007, U.S. patent application Ser. No. 10/453,783 filed on Jun. 2, 2003, U.S. patent application Ser. No. 10/453,199 filed on Jun. 2, 2003 that issued as U.S. Pat. No. 7,095,645 on Aug. 22, 2006, U.S. patent application Ser. No. 10/453,373 filed on Jun. 2, 2003 that issued as U.S. Pat. No. 7,148,579 on Dec. 12, 2006, U.S. patent application Ser. No. 11/185,219 filed on Jul. 19, 2005, U.S. patent application Ser. No. 11/490,408, and U.S. patent application Ser. No. 12/062,323 filed herewith on Apr. 3, 2008. All of these applications are hereby incorporated by reference herein in their entirety. Persons skilled in the art will appreciate that any of the advantageous techniques described in these incorporated applications may be applied to the described embodiments to improve or alter the application, performance and/or structure of any of the illustrated nanoelectromechanical systems.

Persons skilled in the art will also appreciate that the invention can be practiced by other than the described embodiments, which are presented for the purpose of illustration rather than of limitation.

What is claimed is:

1. A nanoelectromechanical system, comprising:
    a base;
    a first conductive layer and a second conductive layer formed on said base;
    a first plurality of nanometer-scale beams electrically coupled to and extending substantially perpendicularly from said first conductive layer, each one of said first plurality having a first free-moving portion;
    a second plurality of nanometer-scale beams electrically coupled to and extending substantially perpendicularly from said second conductive layer, each one of said second plurality having a second free-moving portion, wherein said second free-moving portions are able to electrically couple said first free-moving portions;
    an electric field that affects the movement of said first free-moving portions and said second free-moving portions;
    a first conductive wall fixed to said base; and
    a second conductive wall fixed to said base, wherein said first and said second conductive walls provide said electric field, and said first and said second conductive layers are located between said first and said second conductive walls.

2. The nanoelectromechanical system of claim 1, wherein said first free-moving portions and said second free-moving portions are operable to vibrate.

3. The nanoelectromechanical system of claim 1, wherein said first free-moving portions and said second free-moving portions vibrate as a result of at least one of ambient temperature, light, electrostatic forces, and electromagnetic forces.

4. The nanoelectromechanical system of claim 1, wherein said first free-moving portions electrically couple said second free-moving portions when at least one of said first free-moving portions bends towards at least one of said second free-moving portions and said at least one of said second free-moving portions bends towards said at least one of said first free-moving portions such that said at least one first free-moving portion and said at least one second free-moving portion physically touch.

5. The nanoelectromechanical system of claim 1, further comprising:
    control circuitry coupled to said first and second conductive walls, wherein said control circuitry is configured to provide voltage signals to said first and second conductive walls to generate said electric field.

6. The nanoelectromechanical system of claim 1, wherein a first charge is provided to said first conductive wall and a second charge is provided to said second wall, wherein said first charge and said second charge generate said electric field between said first and second conductive walls.

7. The nanoelectromechanical system of claim 6, wherein said electric field is a first electric field, said nanoelectromechanical system further comprising:
    a third conductive wall, wherein said first charge is provided to said third conductive wall, and wherein said second charge of said second wall and said first charge of said third conductive wall interact to generate a second electric field with substantially the same intensity as said first electric field.

8. The nanoelectromechanical system of claim 7, wherein said first conductive layer comprises a first section located between said first and second conductive walls and a second section located between said second and third conductive walls.

9. The nanoelectromechanical system of claim 8, wherein said second conductive layer comprises a third section located between said first and second conductive walls and a fourth section located between said second and third conductive walls.

10. The nanoelectromechanical system of claim 8, further comprising:
    a third plurality of nanometer-scale beams coupled to and extending perpendicularly from said second section of said first conductive layer.

11. The nanoelectromechanical system of claim 8 further comprising:
    a third conductive layer coupled to said base and located between said second and third conductive walls; and
    a fourth plurality of nanometer-scale beams electrically coupled to and extending perpendicularly from said third conductive layer.

12. The nanoelectromechanical system of claim 7 further comprising:
    a fourth wall having a conductive portion, wherein said second free-moving portions are able to electrically couple said first free-moving portions through said conductive portion.

13. The nanoelectromechanical system of claim 1, wherein said second free-moving portions are able to contact said first free-moving portions at a contact rate, and wherein said electric field affects said contact rate.

14. The nanoelectromechanical system of claim 1, wherein said first plurality and said second plurality of nanometer-scale beams comprise nanowires, nanotubes, or piezoelectric elements.

15. A nanoelectromechanical system, comprising:
    a base;
    a first conductive layer and a second conductive layer formed on said base;
    a first plurality of nanometer-scale beams electrically coupled to and extending substantially perpendicularly from said first conductive layer, each one of said first plurality having a first free-moving portion;
    a second plurality of nanometer-scale beams electrically coupled to and extending substantially perpendicularly from said second conductive layer, each one of said second plurality having a second free-moving portion, wherein said second free-moving portions are able to electrically couple said first free-moving portions;

an electric field that affects the movement of said first free-moving portions and said second free-moving portions, wherein said second free-moving portions are able to contact said first free-moving portions at a contact rate, and wherein said electric field affects said contact rate; and sense circuitry coupled to said first and second conductive layers and configured to detect said contact rate.

16. The nanoelectromechanical system of claim 15, wherein a third charge is provided to said first conductive layer, a fourth charge is provided to said second conductive layer, and said electric field affects said contact rate as a result of said electric field interacting with said third and fourth charges.

17. The nanoelectromechanical system of claim 16, wherein said third charge has a positive polarity, said fourth charge has a negative polarity, said electric field points in a direction from said first conductive layer to said second conductive layer, and said contact rate increases when an intensity of said electric field increases in said direction.

18. The nanoelectromechanical system of claim 16, wherein said third charge has a positive polarity, said fourth charge has a negative polarity, said electric field points in a direction from said second conductive layer to said first conductive layer, and said contact rate decreases when an intensity of said electric field increases in said direction.

19. The nanoelectromechanical system of claim 15, wherein said first plurality of nanometer-scale beams are operable to generate an electric potential, said electric potential being provided as a voltage across said first and second conductive layers when said first free-moving portions electrically couple said second free-moving portions.

20. The nanoelectromechanical system of claim 19, wherein an average voltage is provided across said first and second conductive layers, and wherein said average voltage is affected by said contact rate.

21. The nanoelectromechanical system of claim 20, wherein said electric field points in a direction that causes said voltage to be of a first polarity.

22. The nanoelectromechanical system of claim 21, wherein changing said direction of said electric field causes said voltage to change to a second polarity, wherein said second polarity is different from said first polarity.

* * * * *